US012768880B2

(12) United States Patent
Yamada

(10) Patent No.: US 12,768,880 B2
(45) Date of Patent: Oct. 20, 2026

(54) TEMPERATURE ADJUSTING SYSTEM, CONTROLLER, ELECTRONIC DEVICE HANDLING APPARATUS, TESTER, AND ELECTRONIC DEVICE TESTING APPARATUS

(71) Applicant: ADVANTEST Corporation, Tokyo (JP)

(72) Inventor: Yuya Yamada, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 189 days.

(21) Appl. No.: 18/678,474

(22) Filed: May 30, 2024

(65) Prior Publication Data

US 2024/0402240 A1 Dec. 5, 2024

(30) Foreign Application Priority Data

Jun. 1, 2023 (JP) ................................ 2023-090980

(51) Int. Cl.
*G01R 31/28* (2006.01)

(52) U.S. Cl.
CPC ..... *G01R 31/2875* (2013.01); *G01R 31/2867* (2013.01)

(58) Field of Classification Search
CPC ............ G01R 31/2875; G01R 31/2867; G01R 31/2874; G01R 31/2887; G01R 31/2891; G05D 23/22; G01K 15/005
USPC .................................................... 324/750.03
See application file for complete search history.

(56) References Cited

U.S. PATENT DOCUMENTS 5,652,754 A * 7/1997 Pizzica ................. G06F 11/277 714/732
6,552,561 B2 * 4/2003 Olsen ................. G05D 23/1934 324/73.1
7,008,804 B2 3/2006 Song et al.
9,261,555 B2 2/2016 Yoon et al.
10,514,416 B2 12/2019 Watanabe
11,340,638 B2 5/2022 Sasaki et al.
2002/0121913 A1 * 9/2002 Miller ............... G01R 31/2874 324/750.08

(Continued)

FOREIGN PATENT DOCUMENTS

JP 2014191808 A 10/2014
JP 2023016503 A 2/2023

(Continued)

OTHER PUBLICATIONS

Office Action issued in corresponding Korean Patent Application No. 10-2024-0070497, mailed Jun. 16, 2025 (21 pages).

(Continued)

*Primary Examiner* — Christopher P McAndrew

(74) *Attorney, Agent, or Firm* — Osha Bergman Watanabe & Burton LLP

(57) ABSTRACT

A temperature adjusting system includes a temperature adjuster that adjusts a temperature of a device under test (DUT) and a first acquirer that acquires a first digital signal and outputs a second digital signal. The first digital signal is output from a first temperature detecting circuit in the DUT (Continued)

and indicates an internal temperature of the DUT. The temperature adjusting system includes a controller that controls the temperature adjuster using the second digital signal.

22 Claims, 11 Drawing Sheets

(56) References Cited

U.S. PATENT DOCUMENTS

| | | | | |
|---|---|---|---|---|
| 2010/0066398 | A1* | 3/2010 | Ando | G01R 31/2874 324/750.09 |
| 2013/0100984 | A1* | 4/2013 | Agawa | G01K 15/005 374/161 |
| 2014/0062513 | A1 | 3/2014 | Johnson et al. | |
| 2014/0297056 | A1 | 10/2014 | Akaike et al. | |
| 2018/0038905 | A1* | 2/2018 | Yang | G01R 31/2874 |
| 2019/0101587 | A1* | 4/2019 | Watanabe | G01R 31/2874 |
| 2019/0302178 | A1 | 10/2019 | Saito | |
| 2019/0360869 | A1* | 11/2019 | Cao | G01K 7/00 |
| 2020/0241040 | A1* | 7/2020 | Yoshino | G05D 23/1904 |
| 2020/0241582 | A1* | 7/2020 | Sasaki | G01R 1/0458 |
| 2020/0371158 | A1* | 11/2020 | Kato | G01R 1/0466 |
| 2021/0018558 | A1* | 1/2021 | Tsai | G11C 29/06 |
| 2022/0136909 | A1 | 5/2022 | Kim et al. | |
| 2022/0221508 | A1* | 7/2022 | Lou | G01R 31/2874 |
| 2023/0023699 | A1 | 1/2023 | Kiyokawa et al. | |
| 2023/0417826 | A1* | 12/2023 | Werner | G01R 35/005 |

FOREIGN PATENT DOCUMENTS

| | | | |
|---|---|---|---|
| KR | 20190038295 | A | 4/2019 |
| TW | 201520719 | A | 6/2015 |
| WO | 2022111821 | A1 | 6/2022 |
| WO | 2023084612 | A1 | 5/2023 |
| WO | 2023084613 | A1 | 5/2023 |

OTHER PUBLICATIONS

Laczewski, Andrzej, et al.; “Flexible Temperature Control Solution for Integrated Circuits Testing—Silicon Creations Thermal Elephant”; MDPI; Electronics, 11, 3766; 2022 (10 pages).

Office Action issued in the counterpart Taiwanese Patent Application No. 113116810, mailed Dec. 2, 2024 (4 pages).

* cited by examiner

TEMPERATURE ADJUSTING SYSTEM, CONTROLLER, ELECTRONIC DEVICE HANDLING APPARATUS, TESTER, AND ELECTRONIC DEVICE TESTING APPARATUS

CROSS-REFERENCE TO RELATED APPLICATIONS

The present application claims priority to Japanese Patent Application No. 2023-090980, filed on Jun. 1, 2023. The contents of this application are incorporated herein by reference in their entirety.

BACKGROUND

Technical Field

The present invention relates to a temperature adjusting system and a controller used for adjusting the temperature of an electronic device under test (hereinafter simply referred to as a "DUT" (Device Under Test)) such as a semiconductor integrated circuit element, and an electronic device handling apparatus, a tester and an electronic device testing apparatus used for testing the DUT.

Discussion of the Background

The electronic device testing apparatus includes a controlling device that calculates the temperature of a DUT using an analog signal output from a thermal diode provided in the DUT and controls a temperature adjusting device based on the calculation result (refer to, for example, Patent Document 1).

PATENT DOCUMENT

PATENT DOCUMENT 1: US 2019/0101587 A1

The above-described analog signal output from the thermal diode is not calibrated. Further, in the DUT, the forming position of the thermal diode may be far from the forming position of the main circuit to be tested. Therefore, in the above controlling device, the accuracy of detecting the temperature of the DUT may be not high, and it may be necessary to manually preset a correction value for finely adjusting the calculation result. Particularly, when testing a large number of DUTs at the same time, this adjusting work requires an enormous amount of time, and a large burden is imposed on the launching of a test of a new kind of DUT.

SUMMARY

One or more embodiments provide a temperature adjusting system, a controller, an electronic device handling apparatus, a tester, and an electronic device testing apparatus capable of speeding up the launching of the test of the new kind of DUT.

An aspect 1 of one or more embodiments is a temperature adjusting system comprising: a temperature adjuster that adjusts a temperature of a device under test (DUT); a first acquirer that acquires a first digital signal and outputs a second digital signal, the first signal being output from a first temperature detecting circuit included in the DUT and indicating an internal temperature of the DUT; and a controller that controls the temperature adjuster using the second digital signal.

An aspect 2 of one or more embodiments may be the temperature adjusting system of the aspect 1, wherein the first acquirer may include a signal generator that generates the second digital signal using the first digital signal.

An aspect 3 of one or more embodiments may be the temperature adjusting system of the aspect 1 or 2, wherein the controller may comprise: a target temperature setting unit that sets a target temperature using the second digital signal; and a control unit that controls the temperature adjuster based on the target temperature.

An aspect 4 of one or more embodiments may be the temperature adjusting system of the aspect 3, wherein the target temperature setting unit may comprise: a reference setting unit that sets a reference value; and a correcting unit that corrects the reference value using the second digital signal to set the target temperature.

An aspect 5 of one or more embodiments may be the temperature adjusting system of the aspect 4, wherein the correcting unit may comprise: a first calculating unit that calculates a difference between the reference value and the second digital signal; an adjusting unit that adjusts the difference; and a second calculating unit that adds the difference adjusted by the adjusting unit to the reference value.

An aspect 6 of one or more embodiments be the temperature adjusting system of the aspect 5, wherein the adjusting unit may adjust the difference so that the difference becomes small.

An aspect 7 of one or more embodiments may be the temperature adjusting system of any one of the aspects 3 to 6, wherein the temperature adjusting system may comprise a second acquirer that acquires a current temperature of the DUT, the control unit may control the temperature adjuster based on the target temperature and the current temperature of the DUT acquired by the second acquirer.

An aspect 8 of one or more embodiments may be the temperature adjusting system of the aspect 7, wherein the second acquirer may acquire an analog signal from a second temperature detecting circuit included in the DUT, and the analog signal may indicate the current temperature of the DUT.

An aspect 9 of one or more embodiments may be the temperature adjusting system of the aspect 1 or 2, wherein the temperature adjusting system may comprise a second acquirer that acquires a current temperature of the DUT, the controller may comprise: a correcting unit that corrects the current temperature using the second digital signal; and a control unit that controls the temperature adjuster based on the current temperature corrected by the correcting unit.

An aspect 10 of one or more embodiments may be the temperature adjusting system of the aspect 9, wherein the second acquirer may acquire an analog signal from a second temperature detecting circuit included in the DUT, and the analog signal may indicate the current temperature of the DUT.

An aspect 11 of one or more embodiments may be the temperature adjusting system of the aspect 9 or 10, wherein the controller may comprise a reference setting unit that sets a reference value, and the control unit may control the temperature adjuster based on the reference value and the current temperature corrected by the correcting unit.

An aspect 12 of one or more embodiments may be the temperature adjusting system of any one of the aspects 9 to 11, wherein the correcting unit may comprise: a first calculating unit that calculates a difference between the current temperature and the second digital signal; an adjusting unit that adjusts the difference; and a second calculating unit that adds the difference adjusted by the adjusting unit to the current temperature.

An aspect 13 of one or more embodiments may be the temperature adjusting system of the aspect 12, wherein the adjusting unit may adjust the difference so that the difference becomes small.

An aspect 14 of one or more embodiments may be the temperature adjusting system of any one of the aspects 1 to 13, wherein the second digital signal may be irregularly output from the first acquirer to the controller, and the controller may comprise a converting unit that converts the second digital signal from an irregular signal to a regular signal.

An aspect 15 of one or more embodiments may be the temperature adjusting system of any one of the aspects 1 to 14, wherein the first acquirer may comprise an acquiring unit that acquires the first digital signal from the first temperature detecting circuit using a test program (test instructions) that performs a test of the DUT.

An aspect 16 of one or more embodiments may be the temperature adjusting system of any one of the aspects 1 to 15, wherein the first acquirer may comprise a normalization processing unit that executes normalization processing on the first digital signal.

An aspect 17 of one or more embodiments may be the temperature adjusting system of any one of the aspects 1 to 16, wherein the first acquirer may comprise an averaging processing unit that executes averaging processing on the first digital signal.

An aspect 18 of one or more embodiments may be the temperature adjusting system of any one of the aspects 1 to 15, wherein the first acquirer may comprise: a normalization processing unit that executes normalization processing on the first digital signal; an averaging processing unit that executes averaging processing on the first digital signal; and a switching unit that enables or disables the normalization processing unit or the averaging processing unit.

An aspect 19 of one or more embodiments may be the temperature adjusting system of any one of the aspects 1 to 18, wherein the first temperature detecting circuit may comprise: a measuring unit that measures the internal temperature of the DUT; and a calibrating unit that calibrates a measurement result of the measuring unit, and the first temperature detecting circuit may output the measurement result calibrated by the calibrating unit as the first digital signal to the first acquirer.

An aspect 20 of one or more embodiments is a temperature adjusting system comprising: a temperature adjuster that adjusts a temperature of a device under test (DUT); a first acquirer that acquires an internal temperature of the DUT and outputs a first signal; a second acquirer that acquires a current temperature of the DUT and outputs a second signal; and a controller that controls the temperature adjuster using the first signal and the second signal.

An aspect 21 of one or more embodiments may be the temperature adjusting system of the aspect 20, wherein the first acquirer may acquire a digital signal that is output from a first temperature detecting circuit included in the DUT and indicates the internal temperature of the DUT, and the second acquirer may acquire an analog signal that is output from a second temperature detecting circuit included in the DUT and indicates the current temperature of the DUT.

An aspect 22 of one or more embodiments may be the temperature adjusting system of the aspect 21, wherein the first acquirer may acquire the digital signal from the first temperature detecting circuit using a test program that performs a test of the DUT.

An aspect 23 of one or more embodiments may be the temperature adjusting system of the aspect 21 or 22, wherein the first temperature detecting circuit may comprise: a measuring unit that measures the internal temperature of the DUT; and a calibrating unit that calibrates a measurement result of the measuring unit, and the first temperature detecting circuit may output the measurement result calibrated by the calibrating unit as the first digital signal to the first acquirer.

An aspect 24 of one or more embodiments may be the temperature adjusting system of any one of the aspects 21 to 23, wherein the second temperature detecting circuit may comprise a thermal diode.

An aspect 25 of one or more embodiments may be the temperature adjusting system of any one of the aspects 21 to 24, wherein the second acquirer may comprise an A/D converter that converts the analog signal into a digital signal, and the second acquirer may output the digital signal as the second signal.

An aspect 26 of one or more embodiments is a controller that controls a temperature adjuster that adjusts a temperature of a device under test (DUT), wherein the controller controls the temperature adjuster using a second digital signal, and the second digital signal is a signal output from the first acquirer that acquires a first digital signal, and the first signal is output from a first temperature detecting circuit included in the DUT and indicates an internal temperature of the DUT.

An aspect 27 of one or more embodiments may be the controller of the aspect 26, wherein the controller may comprise: a target temperature setting unit that sets a target temperature using the second digital signal; and a control unit that controls the temperature adjuster based on the target temperature.

An aspect 28 of one or more embodiments may be the controller of the aspect 27, wherein the target temperature setting unit may comprise: a reference setting unit that sets a reference value; and a correcting unit that corrects the reference value using the second digital signal to set the target temperature.

An aspect 29 of one or more embodiments may be the controller of the aspect 28, wherein the correcting unit may comprise: a first calculating unit that calculates a difference between the reference value and the second digital signal; an adjusting unit that adjusts the difference; and a second calculating unit that adds the difference adjusted by the adjusting unit to the reference value.

An aspect 30 of one or more embodiments may be the controller of the aspect 29, wherein the adjusting unit may adjust the difference so that the difference becomes small.

An aspect 31 of one or more embodiments may be the controller of any one of the aspects 27 to 30, wherein the control unit may control the temperature adjuster based on the target temperature and a current temperature of the DUT acquired by a second acquirer.

An aspect 32 of one or more embodiments may be the controller of the aspect 31, wherein the second acquirer may acquire an analog signal from a second temperature detecting circuit included in the DUT, and the analog signal may indicate the current temperature of the DUT.

An aspect 33 of one or more embodiments may be the controller of the aspect 26, wherein the controller may comprise: a correcting unit that corrects a current temperature of the DUT acquired by a second acquirer using the second digital signal; and a control unit that controls the temperature adjuster based on the current temperature corrected by the correcting unit.

An aspect 34 of one or more embodiments may be the controller of the aspect 33, wherein the second acquirer may acquire an analog signal from a second temperature detecting circuit included in the DUT, and the analog signal may indicate the current temperature of the DUT.

An aspect 35 of one or more embodiments may be the controller of the aspect 33 or 34, wherein the controller may comprise a reference setting unit that sets a reference value, and the control unit may control the temperature adjuster based on the reference value and the current temperature corrected by the correcting unit.

An aspect 36 of one or more embodiments may be the controller of any one of the aspects 33 to 35, wherein the correcting unit may comprise: a first calculating unit that calculates a difference between the current temperature and the second digital signal; an adjusting unit that adjusts the difference; and a second calculating unit that adds the difference adjusted by the adjusting unit to the current temperature.

An aspect 37 of one or more embodiments may be the controller of the aspect 36, wherein the adjusting unit may adjust the difference so that the difference becomes small.

An aspect 38 of one or more embodiments may be the controller of any one of the aspects 26 to 37, wherein the second digital signal may be irregularly output from the first acquirer to the controller, and the controller may comprise a converting unit that converts the second digital signal from an irregular signal to a regular signal.

An aspect 39 of one or more embodiments may be the controller of any one of the aspects 26 to 38, wherein the first digital signal may be a signal acquired by the first acquirer from the first temperature detecting circuit using a test program that performs a test of the DUT.

An aspect 40 of one or more embodiments may be the controller of any one of the aspects 26 to 39, wherein the first temperature detecting circuit may comprise: a measuring unit that measures the internal temperature of the DUT; and a calibrating unit that calibrates a measurement result of the measuring unit, and the first temperature detecting circuit may output the measurement result calibrated by the calibrating unit as the first digital signal to the first acquirer.

An aspect 41 of one or more embodiments is a controller that controls a temperature adjuster that adjusts a temperature of a device under test (DUT), wherein the controller controls the temperature adjuster using a first signal and a second signal, the first signal is a signal that is output from a first acquirer that acquires an internal temperature of the DUT, and the second signal is a signal that is output from a second acquirer that acquires a current temperature of the DUT.

An aspect 42 of one or more embodiments is an electronic device handling apparatus that handles a device under test (DUT) or a carrier holding the DUT and presses the DUT or the carrier to a socket, the electronic device handling apparatus comprising: a temperature adjuster that adjusts a temperature of the DUT; and the controller of any one of the aspects 26 to 40.

An aspect 43 of one or more embodiments may be the electronic device handling apparatus of the aspect 42, wherein the electronic device handling apparatus may comprise a second acquirer that acquires a current temperature of the DUT.

An aspect 44 of one or more embodiments is an electronic device handling apparatus that handles a device under test (DUT) or a carrier holding the DUT and presses the DUT or the carrier to a socket, the electronic device handling apparatus comprising: a temperature adjuster that adjusts a temperature of the DUT; the controller according to aspect 41; and a second acquirer that acquires a current temperature of the DUT and outputs a second signal.

An aspect 45 of one or more embodiments may be the electronic device handling apparatus of the aspect 44, wherein the second acquirer may acquire an analog signal that is output from a second temperature detecting circuit included in the DUT and indicates the current temperature of the DUT.

An aspect 46 of one or more embodiments may be the electronic device handling apparatus of the aspect 45, wherein the second temperature detecting circuit may comprise a thermal diode.

An aspect 47 of one or more embodiments may be the electronic device handling apparatus of the aspect 45 or 46, wherein the second acquirer may comprise an A/D converter that converts the analog signal into a digital signal, and the second acquirer may output the digital signal as the second signal.

An aspect 48 of one or more embodiments is a tester tests a device under test (DUT) electrically connected to a socket or the DUT holding in a carrier electrically connected to the socket, the tester comprising a first acquirer that acquires a first digital signal and outputs a second digital signal, the first signal being output from a first temperature detecting circuit included in the DUT and indicating an internal temperature of the DUT.

An aspect 49 of one or more embodiments may be the tester of the aspect 48, wherein the first acquirer may include a signal generator that generates the second digital signal using the first digital signal.

An aspect 50 of one or more embodiments may be the tester of the aspect 48 or 49, wherein the first acquirer may comprise an acquiring unit that acquires the first digital signal from the first temperature detecting circuit using a test program that performs a test of the DUT.

An aspect 51 of one or more embodiments may be the tester of any one of the aspects 48 to 50, wherein the first acquirer may irregularly output the second digital signal to a controller that controls a temperature adjuster that adjusts a temperature of the DUT.

An aspect 52 of one or more embodiments may be the tester of any one of the aspects 48 to 51, wherein the first acquirer may comprise a normalization processing unit that executes normalization processing on the first digital signal.

An aspect 53 of one or more embodiments may be the tester of the any one of the aspects 48 to 52, wherein the first acquirer may comprise an averaging processing unit that executes averaging processing on the first digital signal.

An aspect 54 of one or more embodiments may be the tester of any one of the aspects 48 to 53, wherein the first acquirer may comprise: a normalization processing unit that executes normalization processing on the first digital signal; an averaging processing unit that executes averaging processing on the first digital signal; and a switching unit that enables or disables the normalization processing unit or the averaging processing unit.

An aspect 55 of one or more embodiments may be the tester of any one of the aspects 48 to 54, wherein the first temperature detecting circuit may comprise: a measuring unit that measures the internal temperature of the DUT; and a calibrating unit that calibrates a measurement result of the measuring unit, and the first temperature detecting circuit may output the measurement result calibrated by the calibrating unit as the first digital signal to the first acquirer.

An aspect 56 of one or more embodiments is a tester tests a device under test (DUT) electrically connected to a socket or the DUT holding in a carrier electrically connected to the socket, the tester comprising a first acquirer that acquires an internal temperature of the DUT and outputs a first signal.

An aspect 57 of one or more embodiments may be the tester of the aspect 56, wherein the first acquirer may acquire a digital signal that is output from a first temperature detecting circuit included in the DUT and indicates the internal temperature of the DUT.

An aspect 58 of one or more embodiments may be the tester of the aspect 57, wherein the first acquirer may acquire the digital signal from the first temperature detecting circuit using a test program that performs a test of the DUT.

An aspect 59 of one or more embodiments may be the tester of the aspect 57 or 58, wherein the first temperature detecting circuit may comprise: a measuring unit that measures the internal temperature of the DUT; and a calibrating unit that calibrates a measurement result of the measuring unit, and the first temperature detecting circuit may output the measurement result calibrated by the calibrating unit as the first digital signal to the first acquirer.

An aspect 60 of one or more embodiments is an electronic device testing apparatus that tests a device under test (DUT), comprising the temperature adjusting system according to any one of the aspects 1 to 25.

An aspect 61 of one or more embodiments is an electronic device testing apparatus that tests a device under test (DUT), comprising: a temperature adjuster that adjusts a temperature of the DUT; the controller of any one of the aspects 26 to 40; and the tester of any one of the aspects 48 to 55.

An aspect 62 of one or more embodiments is an electronic device testing apparatus that tests a device under test (DUT), comprising: the electronic device handling apparatus of the aspect 42 or 43; and the tester of any one of the aspects 48 to 55.

An aspect 63 of one or more embodiments may be the electronic device testing apparatus of the aspect 61 or 62, wherein the electronic device testing apparatus may comprise a second acquirer that acquires a current temperature of the DUT.

An aspect 64 of one or more embodiments is an electronic device testing apparatus that tests a device under test (DUT), comprising: a temperature adjuster that adjusts a temperature of the DUT; the controller of the aspect 41; and the tester of any one of the aspects 56 to 59.

An aspect 65 of one or more embodiments is an electronic device testing apparatus that tests a device under test (DUT), comprising: the electronic device handling apparatus of any one of the aspects 44 to 47; and the tester of any one of the aspects 56 to 59.

According to one or more embodiments, the first acquirer acquires the first digital signal that is output from the first temperature detecting circuit included in the DUT and indicates the internal temperature of the DUT and outputs the second digital signal. Therefore, it is possible to shorten the adjusting work, and it is possible to speed up the launching of the test of the new kind of DUT.

DESCRIPTION OF THE EMBODIMENTS

Hereinafter, embodiments will be described with reference to the drawings.

Figure 1:
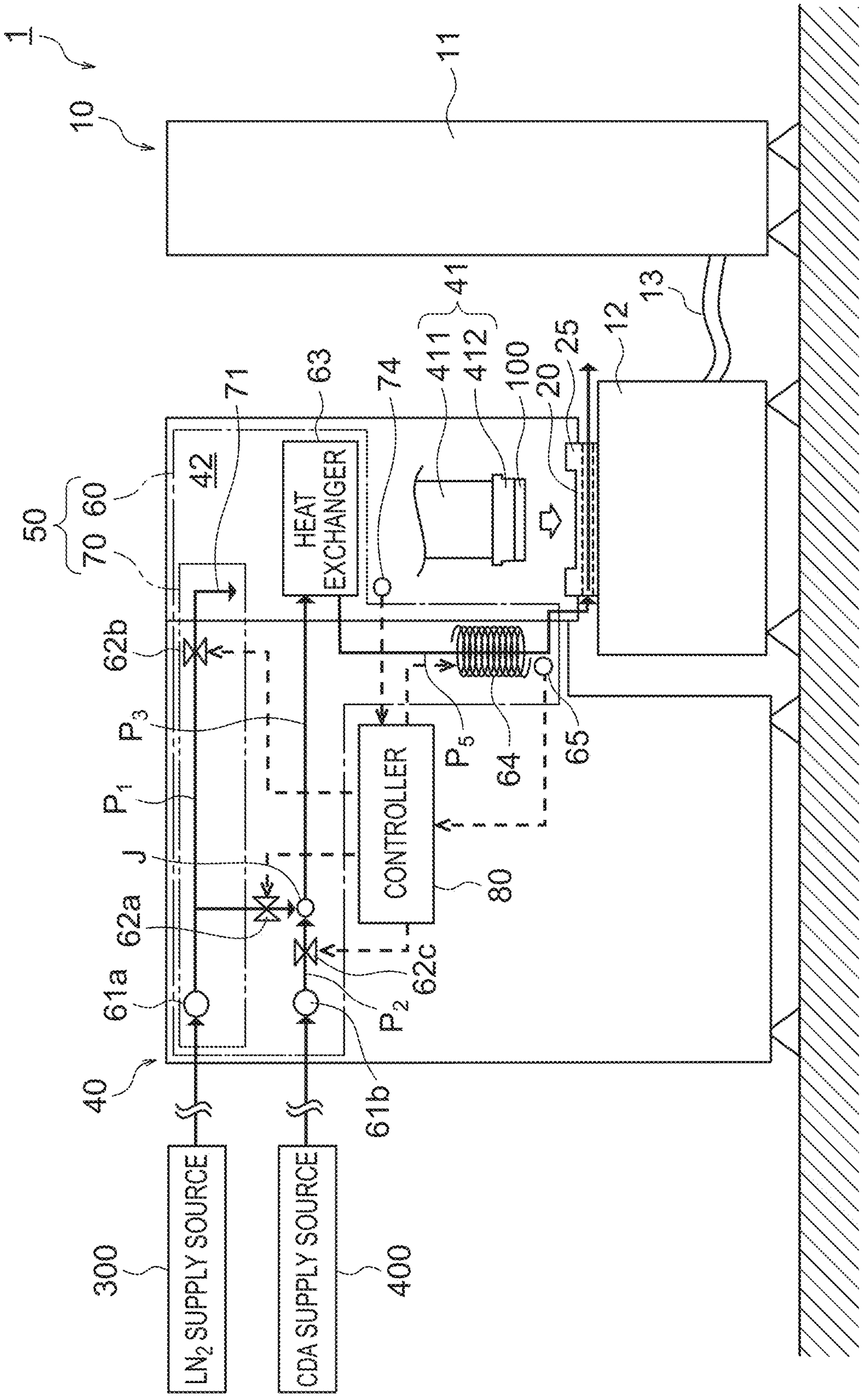
FIG. 1 is a block diagram showing the overall configuration of the electronic device testing apparatus in one or more embodiments.
Figure 2:
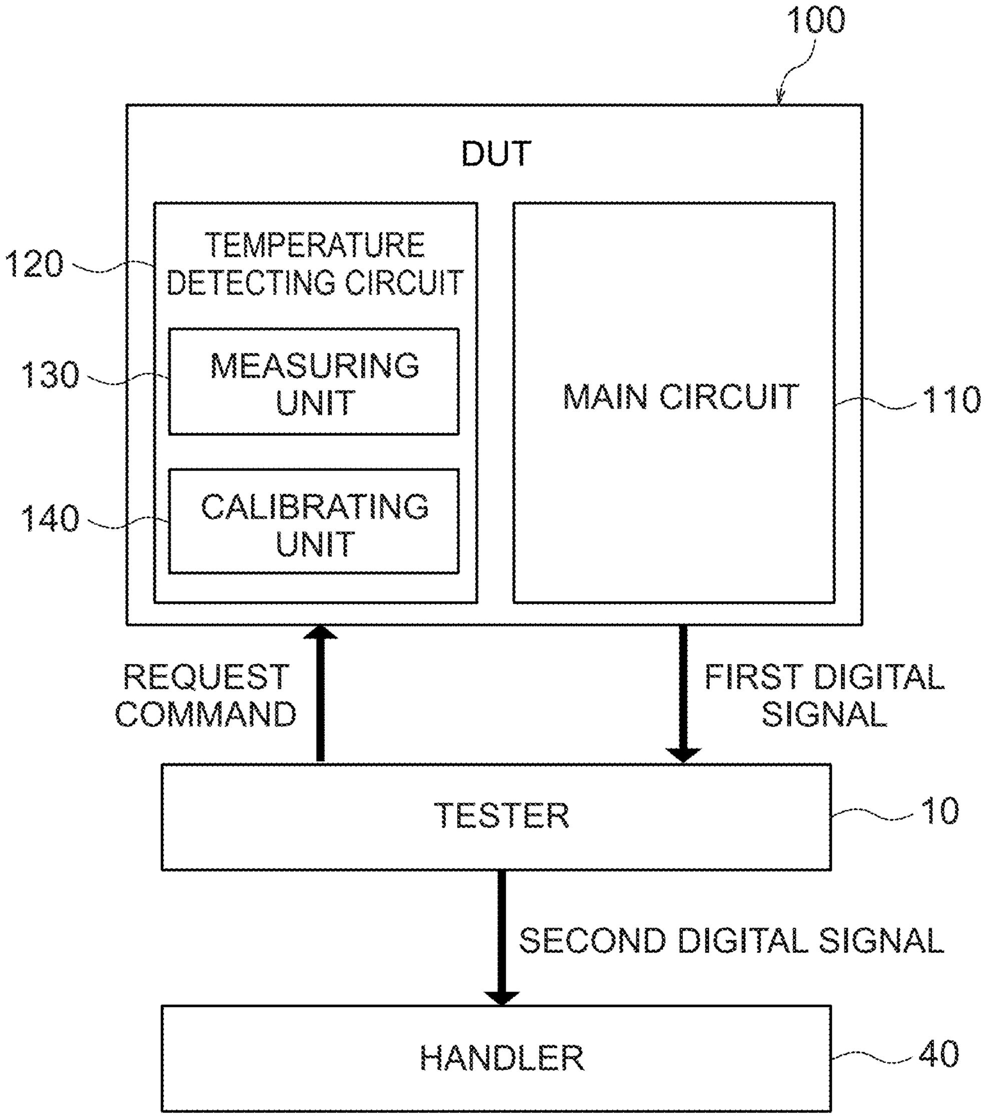
FIG. 2 is a diagram for explaining the configuration of the DUT and the transmission and reception of signals between the DUT, the tester, and the handler in one or more embodiments.
Figure 3:
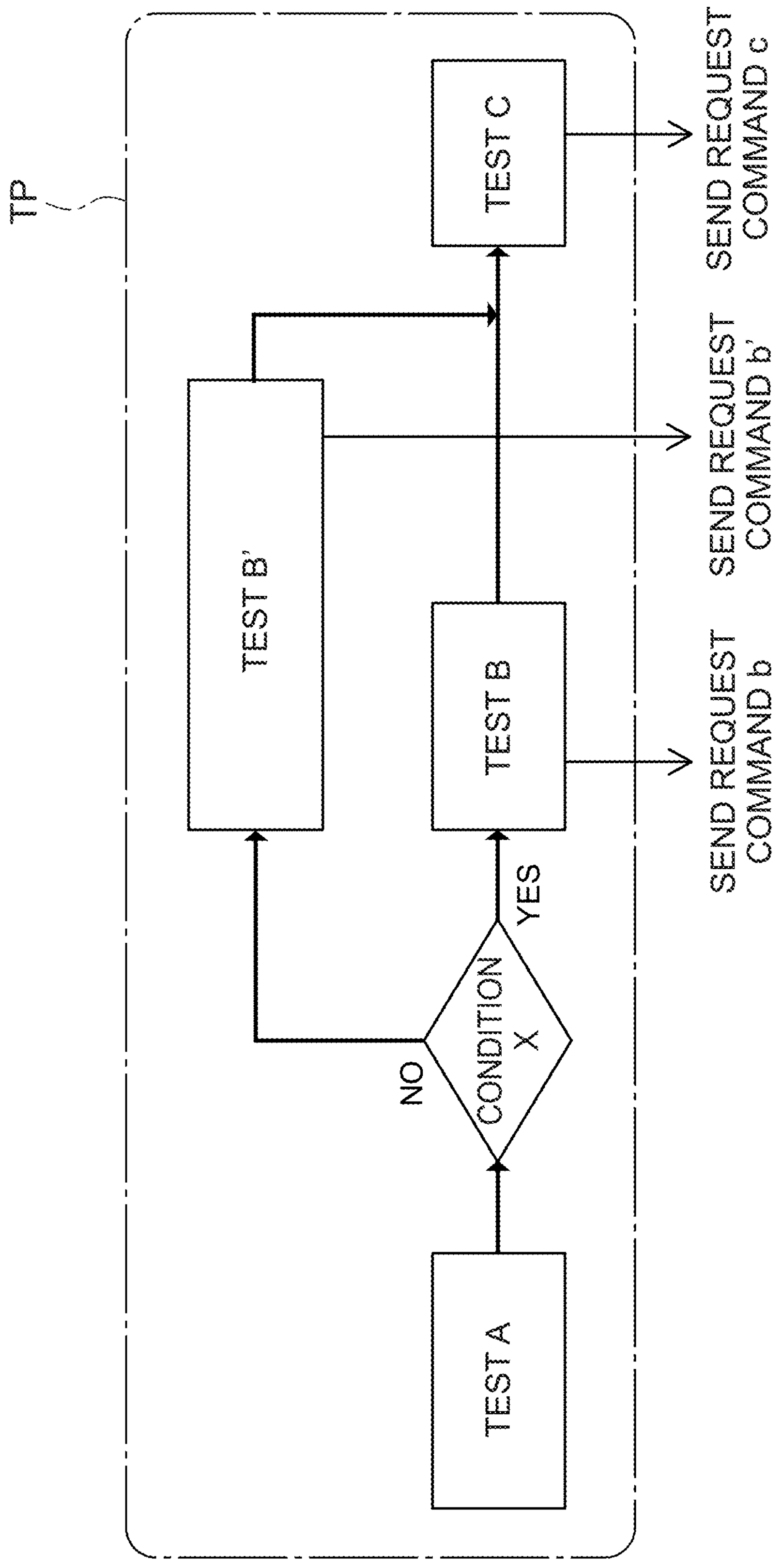
FIG. 3 is a flowchart illustrating an example of the test program in one or more embodiments.
Figure 4:
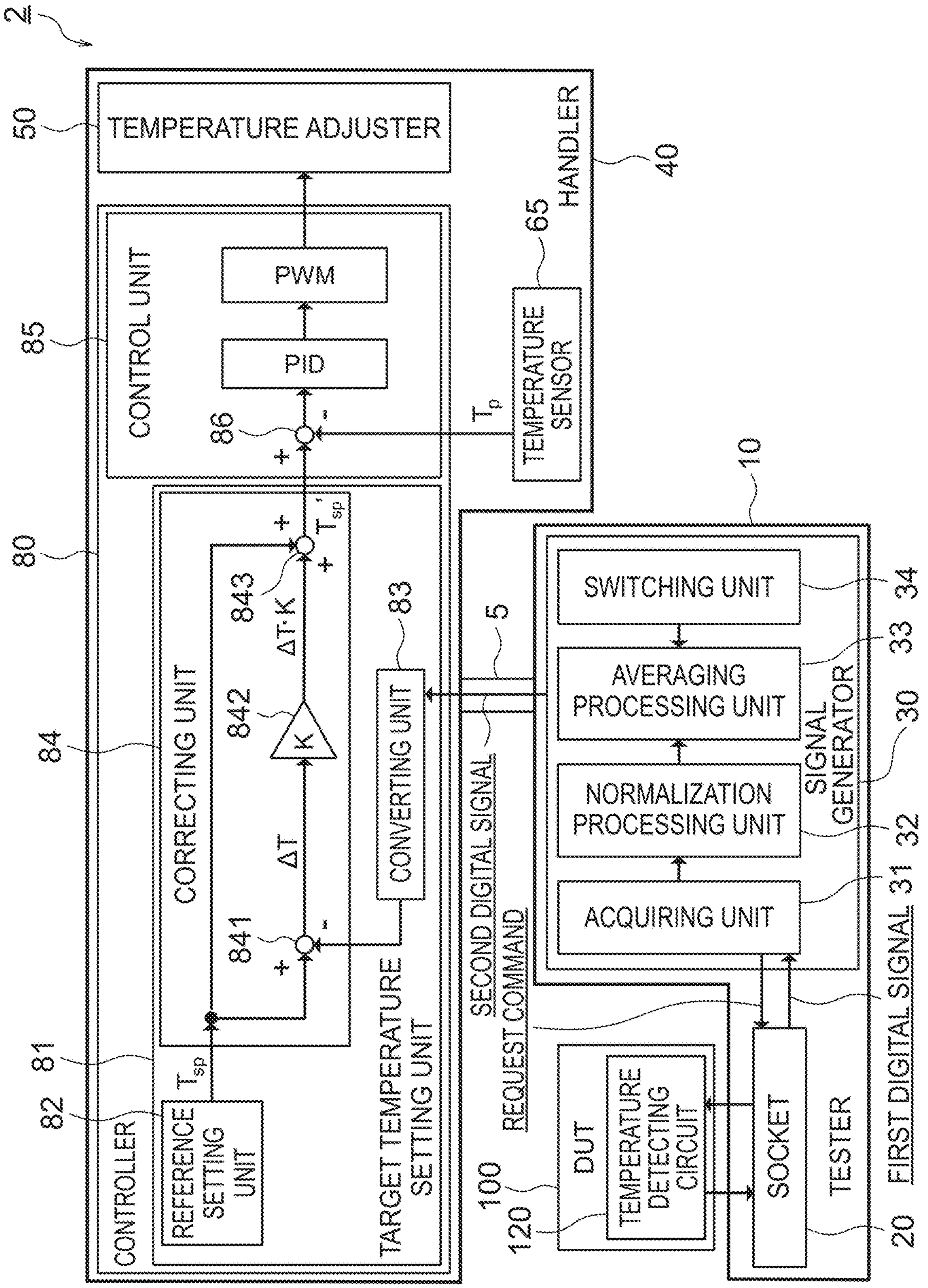
FIG. 4 is a block diagram showing the overall configuration of the temperature adjusting system in one or more embodiments.
Figure 5:
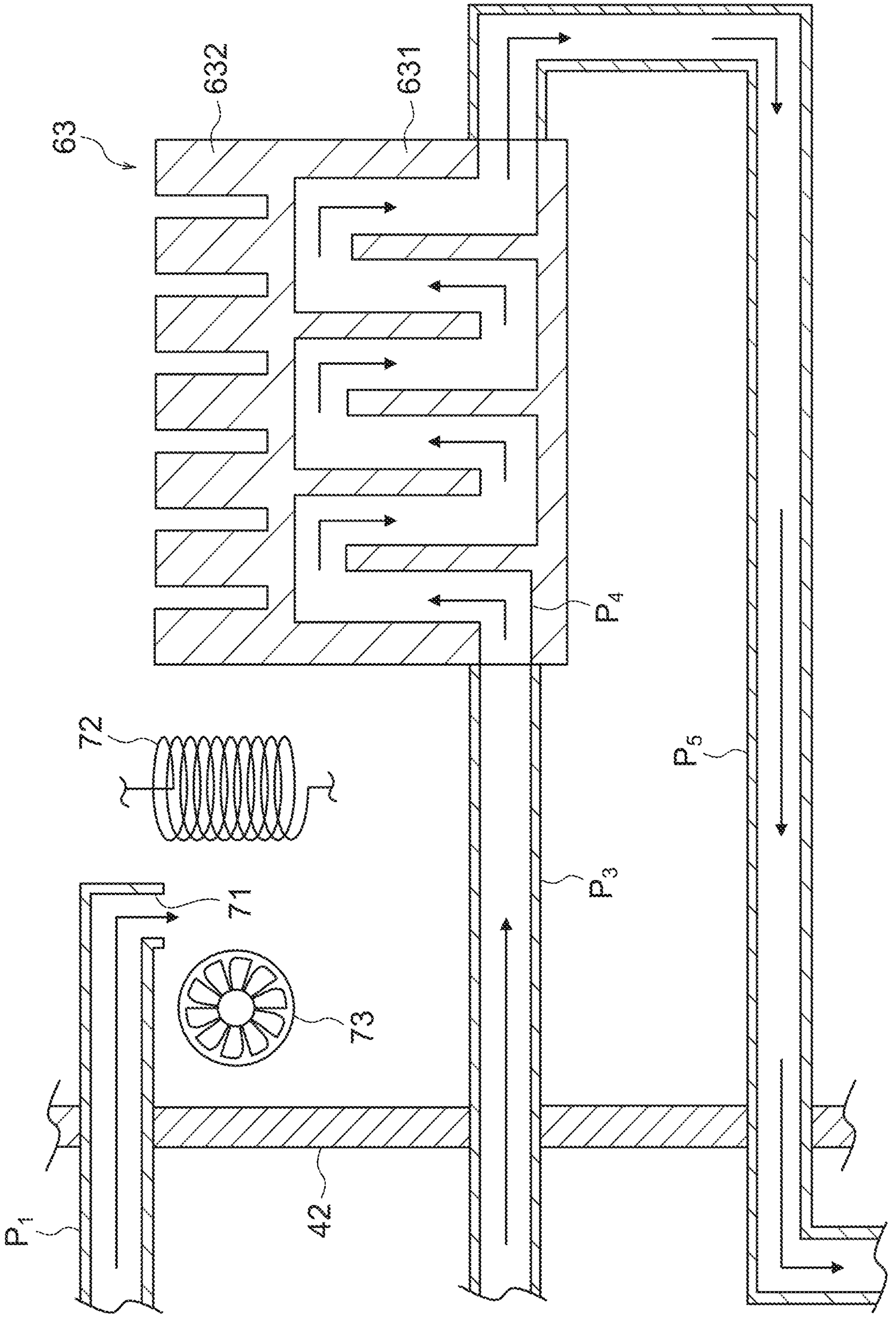
FIG. 5 is a cross-sectional view showing the inside configuration of the chamber of the electronic device testing apparatus in one or more embodiments.
Figure 6:
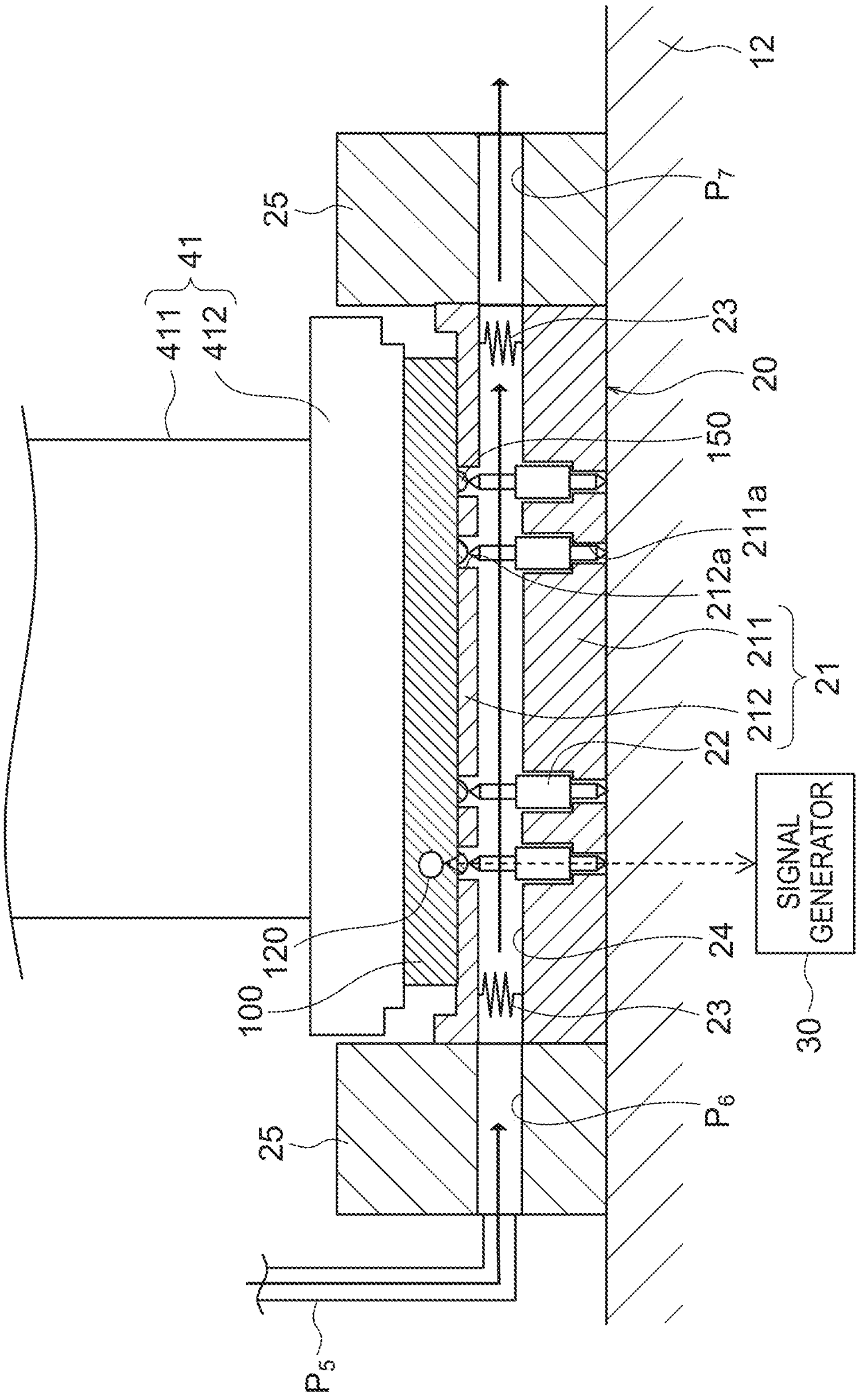
FIG. 6 is a cross-sectional view showing the configuration of the socket of the electronic device testing apparatus in one or more embodiments.

FIG. 1 is a block diagram showing the overall configuration of the electronic device testing apparatus 1 in one or more embodiments, FIG. 2 is a diagram for explaining the configuration of the DUT 100 and the transmission and reception of signals between the DUT 100, the tester 10, and the handler 40 in one or more embodiments, FIG. 3 is a flowchart illustrating an example of the test program (test instructions) TP in one or more embodiments, FIG. 4 is a block diagram showing the overall configuration of the temperature adjusting system 2 in one or more embodiments, FIG. 5 is a cross-sectional view showing the inside configuration of the chamber 42 of the electronic device testing apparatus 1 in one or more embodiments, and FIG. 6 is a cross-sectional view showing the configuration of the socket 20 of the electronic device testing apparatus 1 in one or more embodiments.

The electronic device testing apparatus 1 shown in FIG. 1 is an apparatus that tests the electrical characteristics of the DUT 100 such as a semiconductor integrated circuit element. The electronic device testing apparatus 1 tests whether or not the DUT 100 operates appropriately while applying high or low temperature thermal stress to the DUT 100.

The electronic device testing apparatus 1 includes a tester 10 and a handler 40. The tester 10 performs tests to measure and evaluate the electrical characteristics of the DUT 100. The tester 10 includes a main frame 11 and a test head 12. The test head 12 is connected to the main frame 11 via a cable 13. A socket 20 is mounted on the upper part of the test head 12, and the socket 20 and the test head 12 are electrically connected to each other. A socket guide 25 is disposed around the socket 20.

The handler 40 presses the DUT 100 against the socket 20 to electrically connect the DUT 100 and the socket 20. As a result, the DUT 100 and the test head 12 are electrically connected via the socket 20. Then, the tester 10 inputs a signal from the main frame 11 to the DUT 100 via the cable 13 and the test head 12, and the tester 10 measures and evaluates the output of the DUT 100 corresponding to the input signal.

A specific example of the DUT 100 includes a SoC (System on a chip). The DUT 100 may be a device other than the SoC, such as a logic device or a memory device. The DUT 100 may be a resin molded device in which a semiconductor chip is packaged with a molding material such as a resin material, or the DUT 100 may be a bare die that is not packaged. When the kind of DUT 100 is changed, the socket 20 is replaced with one that corresponds to the shape, number of pins, etc. of the DUT 100.

As shown in FIG. 2, the DUT 100 includes, in addition to the main circuit 110 to be tested, a temperature detecting circuit 120 that outputs a first digital signal indicating the internal temperature of the DUT 100. The temperature detecting circuit 120 corresponds to an example of the "first temperature detecting circuit" in the aspect of one or more embodiments. The temperature detecting circuit 120 is formed on a semiconductor substrate together with the main circuit 110 using a semiconductor manufacturing technique such as photolithography. The temperature detecting circuit 120 includes a measuring unit 130 and a calibrating unit 140 that calibrates the measurement result of the measuring unit 130. The measuring unit 130 is a circuit that measures the internal temperature of the DUT 100. Although not particularly limited, the measuring unit 130 includes an analog temperature sensor and an A/D converter that converts the measurement result of the temperature sensor into a digital signal. The calibrating unit 140 is a circuit that calibrates the measurement result of the measuring unit 130. The temperature detecting circuit 120 is capable of outputting the measurement result calibrated by the calibrating unit 140 to the tester 10 as the first digital signal.

Here, as described above, there is a DUT that includes a thermal diode that can continuously output an analog signal. As compared with such a thermal diode, because the measuring unit 130 is located closer to the main circuit 110, it is possible to measure the temperature of the DUT 100 with higher accuracy. Further, because the output signal of the thermal diode described above is an analog signal, an uncalibrated value is output as it is from the DUT. On the other hand, the output of the temperature detecting circuit 120 is a digital signal and is calibrated with high accuracy in the front-end process test, and the calibrating unit 140 calibrates the measurement result of the measuring unit 130 based on the calibration data. Therefore, it is possible to detect the temperature of the DUT 100 with higher accuracy. The DUT 100 may include the above-mentioned thermal diode 160 (see FIG. 9 and FIG. 11) that outputs an analog signal in addition to the temperature detecting circuit 120.

Although the main circuit 110 and the temperature detecting circuit 120 are shown separately in FIG. 2 for convenience, these are actually formed integrally, and the temperature detecting circuit 120 is also electrically connected to terminals 150 (see FIG. 6 to FIG. 8) of the DUT 100 that are electrically connected to the main circuit 110. Therefore, as shown in FIG. 2 to FIG. 4, it is possible to acquire the first digital signal from the temperature detecting circuit 120 via the socket 20 to which the terminals 150 are electrically connected using the test program TP performed by the tester 10. Although not particularly limited, a specific example of the DUT 100 including such a temperature detecting circuit 120 includes a device provided by Synopsys, Inc.

The tester 10 has the test program TP that performs a test of the DUT 100. Further, as shown in FIG. 4, the tester 10 includes a signal generator 30 that generates a second digital signal for controlling a temperature adjustor 50 described later. The signal generator 30 generates the second digital signal using the first digital signal output from the temperature detecting circuit 120 described above. The signal generator 30 includes an acquiring unit 31, a normalization processing unit 32, an averaging processing unit 33, and a switching unit 34. The signal generator 30 may not include at least one of the normalization processing unit 32, the averaging processing unit 33 and the switching unit 34. When the signal generator 30 does not include the normalization processing unit 32, the averaging processing unit 33 and the switching unit 34, the signal generator 30 directly outputs the first digital signal output from the temperature detecting circuit 120 as the second digital signal.

The signal generator 30 is functionally realized by, for example, a computer that controls the tester 10. Although not particularly shown, the computer is an electronic computer including a CPU (processor), a main storage device (such as a RAM), a secondary storage device (such as a hard disk and an SSD), interfaces, and the like. The computer can functionally realize the acquiring unit 31, the normalization processing unit 32, the averaging processing unit 33, and the switching unit 34 by reading and executing a program stored in the secondary storage device.

The acquiring unit 31 acquires the first digital signal from the temperature detecting circuit 120 using the test program TP executed by the tester 10 and outputs the first digital signal to the normalization processing unit 32. In this way, by acquiring the first digital signal using the test program TP, the acquiring unit 31 can acquire the internal temperature of the DUT 100 during the test of the DUT 100, and it is possible to detect the temperature with higher accuracy.

Specifically, as shown in FIG. 2 to FIG. 4, the acquiring unit 31 sends a request command written in the test program TP to the DUT 100. The request command is a signal requesting the temperature detecting circuit 120 to output the first digital signal. Based on the request command, the temperature detecting circuit 120 of the DUT 100 measures the internal temperature of the DUT 100 by the measuring unit 130, calibrates the measurement result by the calibrating unit 140, and then sends the first digital signal to the acquiring unit 31. The acquiring unit 31 sends the request command at a required time in the test program TP in a pinpoint manner. Although not particularly limited, the acquiring unit 31 acquires the first digital signal by sending the request commands to the DUT 100 at uneven intervals of, for example, ten seconds to several hundred seconds. Although not particularly limited, more specifically, the uneven intervals at which the acquiring unit 31 sends the request commands are 10 seconds or more, preferably 100 seconds or more.

Here, because the test program generally includes a branch and the test to be executed varies in accordance with the branch, the timing (the elapsed time from the start of the test) at which the request command is sent from the test program to the DUT is irregular rather than constant period. This point will be described in detail with reference to an example shown in FIG. 3.

The test program TP shown in FIG. 3 includes a test A, a test B, a test B', and a test B', and a test C, and either of the test B and the test B' is selectively executed based on a condition X. That is, the test program (main program) TP of one or more embodiments includes a plurality of tests (for example, each corresponding to a test suite in which subprogram for executing individual test is described) each of which has a different test content.

In the example shown in FIG. 3, because the description position of the request command b in the test B is different from the description position of the request command b' in the test B', the timing of sending the request command b in the test B is different from the timing of sending the request command b' in the test B'. Further, because the test time of the test B is different from the test time of the test B', the timing at which the request command c is sending in the test C is also changed depending on whether the test B or the test B' is selected at the condition X. In this way, because the test program TP includes the branch (the condition X), the timing at which the acquiring unit 31 acquires the first digital signal from the temperature detecting circuit 120 is unpredictable and irregular.

The test program TP shown in FIG. 3 is merely an example, and for example, the number of tests and the number of conditions included in the test program can be arbitrarily determined. Further, the types of each test and the order in which the tests are executed are not particularly limited and it can be set arbitrarily. Although not particularly limited, specific examples of such tests include contact test, function test, DC test, scan test, power supply current test (power consumption test), and the like. The test program is configured by combining the plurality of types of tests and it is configured to execute the tests in sequence.

The request command can be written in any test after the contact test. In the example shown in FIG. 3, although one request command b, b' or c is sent in each of the test B, B' and C, but it is not particularly limited thereto, and the test program may include a test that does not send the request command. One test may have a plurality of request commands. The test program may include request commands written between tests.

The normalization processing unit 32 shown in FIG. 4 executes normalization processing (data cleansing processing) on the first digital signal acquired by the acquiring unit 31.

First, the normalization processing unit 32 determines whether the first digital signal is normal or abnormal. That is, the normalization processing unit 32 first determines the reliability of the first digital signal. Although not particularly limited, specifically, the normalization processing unit 32 determines whether the first digital signal is normal or abnormal, for example, by determining whether or not the absolute value of the internal temperature of the DUT 100 indicated by the first digital signal is within a predetermined range.

Alternatively, the normalization processing unit 32 may determine whether the first digital signal is normal or abnormal by determining whether the change amount of the first digital signal is within a predetermined range. Specifically, in this case, the normalization processing unit 32 stores the previous first digital signal acquired last time by the acquiring unit 31. Then, the normalization processing unit 32 calculates the change amount between the value of the previous first digital signal and the value of the current first digital signal acquired this time by the acquiring unit 31. Then, the normalization processing unit 32 determines whether the first digital signal is normal or abnormal by determining whether or not the change amount is within a predetermined range. Alternatively, instead of the change amount described above, Bollinger bands calculated based on a plurality of past first digital signals of a plurality of past times may be used.

Then, when the normalization processing unit 32 determines that the first digital signal is normal, the normalization processing unit 32 outputs the first digital signal to the averaging processing unit 33. On the other hand, when the normalization processing unit 32 determines that the first digital signal is abnormal, the normalization processing unit 32 outputs, as the first digital signal, a value (a normal value within a predetermined range) different from the current first digital signal to the averaging processing unit 33. Although not particularly limited, when the normalization processing unit 32 determines that the first digital signal is abnormal, for example, the normalization processing unit 32 outputs, instead of the current first digital signal, the previous first digital signal that is determined to be the normal by the normalization processing unit 32 last time to the averaging processing unit 33.

Alternatively, the normalization processing unit 32 stores the past first digital signal determined to be normal by the normalization processing unit 32, and when the normalization processing unit 32 determines that the first digital signal is abnormal, a moving average of the current first digital signal and the past first digital signal may be calculated, and the calculation result may be output to the averaging processing unit 33. This past first digital signal may be only the previous first digital signal or may be a plurality of past first digital signals of a plurality of past times.

Alternatively, the normalization processing unit 32 may acquire and store the reference value Tsp set in the reference setting unit 82 of the handler 40 described later from the reference setting unit 82, and the normalization processing unit 32 may output the reference value Tsp as it is to the averaging processing unit 33 when the normalization processing unit 32 determines that the first digital signal is abnormal.

Because the normal first digital signal can be output to the handler 40 by the normalization processing even when the first digital signal is an abnormal value or the first digital signal is missing due to mis-contact or communication failure between the DUT 100 and the socket 20, it is possible to stabilize the control of the temperature adjuster 50 by the control device 80.

The averaging processing unit 33 executes averaging processing on the first digital signal output from the normalization processing unit 32 and outputs the calculation result as the second digital signal to the converting unit 83 of the handler 40. As described above, because the first digital signal is irregularly acquired from the temperature detecting circuit 120 by the acquiring unit 31, this second digital signal is also irregularly output from the averaging processing unit 33 to the converting unit 43 of the handler 40. The tester 10 and the handler 40 are connected via a cable 5, and signals and data can be exchanged between the tester 10 and the handler 40 through GBIP communication. The tester 10 and the handler 40 may be connected via LAN.

Although not particularly limited, the following process can be exemplified as a specific example of the averaging processing. For example, the averaging processing unit 33 stores the past first digital signal output from the normalization processing unit 32 and calculates the moving average of the current first digital signal and the past first digital signal. This past first digital signal may be only the previous first digital signal or may be a plurality of past first digital signals of a plurality of past times. By executing such averaging processing on the first digital signal, it is possible to reduce the noise contained in the first digital signal to improve accuracy and to reduce the amount of data communication between the tester 10 and the handler 40.

The plurality of first digital signals averaged by the averaging processing unit 33 may be acquired by the acquiring unit 31 with a plurality of request commands during the same test, may be acquired by the acquiring unit 31 with a plurality of request commands across a plurality of tests, or may be a mixture of these. The averaging processing executed by the averaging processing unit 33 is not particularly limited to the above as long as it can improve accuracy and reduce the amount of data communication.

The switching unit 34 enables or disables the averaging processing unit 33. That is, the switching unit 34 switches between enabling and disabling the averaging processing executed by the averaging processing unit 33 on the first digital signal.

Specifically, when the switching unit 34 enables the averaging processing unit 33, the averaging processing unit 33 executes the above-mentioned averaging processing on the first digital signal output from the normalization processing unit 32. On the other hand, when the switching unit 34 disables the averaging processing unit 33, the averaging processing unit 33 outputs the first digital signal as it is as the second digital signal to the converting unit 83 of the handler 40 without executing the averaging processing on the first digital signal output from the normalizing processing unit 32.

The switching unit 34 may enable or disable the normalization processing unit 32. Specifically, when the switching unit 34 enables the normalization processing unit 32, the normalization processing unit 32 executes the above-mentioned normalization processing on the first digital signal output from the acquiring unit 31. On the other hand, when the switching unit 34 disables the normalization processing unit 32, the normalization processing unit 32 outputs the first digital signal as it is as the first digital signal to the averaging processing unit 33 without executing the normalization processing on the first digital signal output from the acquiring unit 31.

Alternatively, the switching unit 34 may enable or disable the averaging processing unit 33 and also enable or disable the normalization processing unit 32. When the switching unit 34 enables both the normalization processing unit 32 and the averaging processing unit 33, the first digital signal on which both the normalization processing and the averaging processing are executed is output as the second digital signal to the converting unit 83 of the handler 40. On the other hand, when the switching unit 34 enables the normalization processing unit 32 and disables the averaging processing unit 33, the first digital signal on which only the normalization processing is executed is output as the second digital signal to the converting unit 83 of the handler 40. When the switching unit 34 disables the normalization processing unit 32 and enables the averaging processing unit 33, the first digital signal on which only the averaging processing is executed is output as the second digital signal to the converting unit 83 of the handler 40. When the switching unit 34 disables both the normalization processing unit 32 and the averaging processing unit 33, neither the normalization processing nor the averaging processing is executed, and the first digital signal acquired by the acquiring unit 31 is output as it is as the second digital signal to the converting unit 83 of the handler 40.

The operator of the electronic device testing apparatus 1 can select enabling or disabling of the averaging processing unit 33 and the normalization processing unit 32 by operating the switching unit 34 in accordance with the reliability of the first digital signal and the amount of data communication.

Returning to FIG. 1, the handler 40 transports and presses the DUT 100 to the socket 20. The handler 40 includes a contact arm 41 and a chamber 42.

The contact arm 41 includes an arm 411 and a pusher 412. The arm 411 includes an actuator (not shown) for horizontally moving, is capable of move in the front, back, left, and right (XY plane direction) and is capable of move in the up and down direction (Z-axis direction). The pusher 412 is disposed at the distal end of the arm 411. The pusher 412 is capable of holding the DUT 100 by vacuum-suction or the like.

The chamber 42 is a thermostatic chamber including a heat insulating material or the like. Because the chamber 42 is hardly affected by a temperature change from the surrounding environment, it is possible to maintain a constant atmosphere temperature inside the thermostatic chamber. An upper part of the test head 12 enters the chamber 42 through an opening, and the socket 20 is located in the chamber 42.

In the handler 40, the DUT 100 is transported above the socket 20 located in the chamber 42 by horizontally moving the arm 411 while holding the DUT 100 by the pusher 412. Next, the DUT 100 is pressed against the socket 20 by lowering the arm 411. At this time, the pusher 412 is located in the chamber 42.

The handler 40 includes a temperature adjuster 50 that adjusts the temperature of the DUT 100, and a controller 80 that controls the temperature adjuster 50. The temperature adjuster 50 includes a socket temperature adjusting unit 60 that supplies the temperature-adjusted fluid to the inner space 24 of the socket 20, and a chamber temperature adjusting unit 70 that adjusts the atmosphere temperature in the chamber 42.

Here, in a low temperature test for testing whether or not the DUT 100 operates properly at low temperatures, a refrigerant is used as the fluid supplied from the socket temperature adjusting unit 60 to the socket 20. On the other hand, in a high temperature test for testing whether or not the DUT 100 operates properly at high temperatures, a heating medium is used as the fluid. In order to protect the socket, the board of the test head, etc. from such refrigerant or heating medium supplied to the socket 20, a gas is preferable used as the fluid. Further, because the gas hardly causes coagulation and boiling such as liquid, it is possible to widen the temperature range. Although not particularly limited, low-temperature gaseous nitrogen can be exemplified as a specific example of the refrigerant. High temperature air can be exemplified as a specific example of the heating medium.

The socket temperature adjusting unit 60 includes connecting parts 61*a* and 61*b*, flow channels $P_1$ to $P_5$, valves 62*a* to 62*c*, a heat exchanger 63, a heater 64, and a temperature sensor 65.

The connecting part 61*a* is connected to a $LN_2$ supply source 300 that stores liquid nitrogen ($LN_2$) and supplies low temperature nitrogen. The $LN_2$ supply source 300 includes, for example, a pressure vessel storing liquid nitrogen at high pressure and is capable of sending low-temperature gaseous nitrogen and/or liquid nitrogen to the connecting part 61*a*. Alternatively, a liquid nitrogen supply pipeline or the like in a factory may be used as the $LN_2$ supply source 300. The flow channel $P_1$ that branches into two is connected to the connecting part 61*a*, and the branched flow channel $P_1$ is connected to the junction part J and the chamber 42 respectively. The valves 62*a* and 62*b* that adjust the flow rate of nitrogen supplied from the $LN_2$ supply source 300 are provided on the he branched flow channel $P_1$. The valve 62*a* adjusts the flow rate of nitrogen supplied to the junction part J. On the other hand, the valve 62*b* adjusts the flow rate of nitrogen supplied to the inside of the chamber 42. The opening and closing of the valves 62*a* and 62*b* are controlled by the controller 80.

The connecting part 61*b* is connected to a CDA (Compressed Dry Air) supply source 400 that supplies compressed dry air. The CDA supply source 400 includes, for example, a compressor that takes in and compresses outside air, and a dryer that dries the compressed air. Alternatively, an existing factory pipes or the like that can supply compressed dry air may be used as the CDA supply source 400. The flow channel $P_2$ is connected to the connecting part 61*b*, and the downstream side of the flow channel $P_2$ joins the flow channel $P_1$ at the junction part J. The valve 62*c* that adjusts the flow rate of the air supplied from CDA supply source 400 is provided on the flow channel $P_2$. The opening and closing of the valve 62*c* is controlled by the controller 80.

Because the air supplied from this CDA supply source 400 passes through flow channels $P_1$ to $P_7$ through which low-temperature nitrogen also passes, it is preferable to use compressed air having a low dew point temperature in order to prevent dew condensation. Although not particularly limited, the dew point temperature of the compressed dry air under atmosphere pressure is preferably −70° C. or lower.

When performing the low temperature test on the DUT 100, the valves 62*a* and 62*b* that adjust the flow rate of nitrogen are opened, and the valve 62*c* that adjusts the flow rate of air is kept closed. That is, during the low temperature test, nitrogen as a refrigerant is supplied to the socket 20 and the chamber 42, and no air is supplied.

On the other hand, when performing the high temperature test on the DUT 100, the valve 62*c* that adjusts the flow rate of air is opened, and the valves 62*a* and 62*b* that adjust the flow rate of nitrogen are kept closed. That is, during the high temperature test, air is supplied to the socket 20 and no nitrogen is supplied.

As shown in FIG. 1 and FIG. 5, the flow channel $P_3$ is connected to the junction part J, and the downstream side of the flow channel $P_3$ is connected to the heat exchanger 63 inside the chamber 42. The heat exchanger 63 is installed inside the chamber 42 and performs heat exchange between the fluid supplied from the flow channel $P_3$ and the atmosphere inside the chamber 42.

As shown in FIG. 5, the heat exchanger 63 includes a main body 631 and a plurality of fins 632 formed on the main body 631. The flow channel $P_4$ through which the fluid supplied from the flow channel $P_3$ flows is formed inside the main body 631. The flow channel $P_4$ extends from one end of the main body 631 to the other end of the main body 631 and has a meandering linear shape so that the contact area with the main body 631 is large. The fins 632 are provided on the main body 631 so as to be exposed to the inside of the chamber 42. Because the surface area of the heat exchanger 63 is large by the fins 632, it is possible to efficiently exchange heat between the fluid passing through the flow channel $P_4$ and the atmosphere in the chamber 42.

As shown in FIG. 1 and FIG. 5, the chamber temperature adjusting unit 70 includes the connecting part 61*a*, the valve 62*b*, the flow channel $P_1$, a nitrogen outlet 71, a heater 72, a fan 73, and a temperature sensor 74. That is, in one or more embodiments, the socket temperature adjusting unit 60 and the chamber temperature adjusting unit 70 share a part of the flow channel $P_1$, the connecting part 61*a*, and the valve 62*b*.

The nitrogen outlet 71 is connected to the connecting part 61*a* via the flow channel $P_1$. The nitrogen outlet 71 supplies low-temperature nitrogen supplied from the $LN_2$ supply source 300 into the chamber 42 to lower the atmosphere temperature in the chamber 42. On the other hand, the heater 72 is disposed inside the chamber 42 and heats the atmosphere in the chamber 42 to raise the atmosphere temperature.

The fan 73 circulates the atmosphere in the chamber 42 by blowing air to efficiently change the atmosphere temperature. The fan 73 is located upstream of the heat exchanger 63 in the flow of the circulating atmosphere and can blow air to the heat exchanger 63. Further, in one or more embodiments, the heater 72 is located upstream of the heat exchanger 63 and is located downstream of the fan 73. Further, in one or more embodiments, the nitrogen outlet 71 is also located upstream of the heat exchanger 63 and is located downstream of the fan 73. The heater 72 and fan 73 are connected to the controller 80. The controller 80 controls the valve 62*b*, the heater 72, and the fan 73 based on the detection result of the temperature sensor 74 provided inside the chamber 42 to adjust the atmosphere temperature in the chamber 42.

When performing the low-temperature test on the DUT 100, the chamber temperature adjusting unit 70 lowers the atmosphere temperature in the chamber 42 to the target temperature by supplying low-temperature nitrogen into the chamber 42 from the $LN_2$ supply source 300 through the nitrogen outlet 71 while blowing air with the fan 73. If the atmosphere temperature becomes lower than the target temperature, the atmosphere temperature may be heated by the heater 72 as necessary.

During the low temperature test, the low temperature nitrogen is also supplied from the $LN_2$ supply source 300 to the socket temperature adjusting unit 60. Because the set temperature of the atmosphere in the chamber 42 in the low-temperature test is usually higher than the temperature of the nitrogen flowing through the flow channel $P_4$, the nitrogen flowing through the flow channel $P_4$ is heated by the heat exchanger 63.

On the other hand, when performing the high temperature test on the DUT 100, the chamber temperature adjusting unit 70 raises the atmospheric temperature in the chamber 42 to the target temperature using the heater 72 while blowing air using the fan 73. Although room temperature air is supplied from the CDA supply source 400 to the socket temperature adjusting unit 60 during the high temperature test, the set temperature of the atmosphere in the chamber 42 for this high temperature test is usually higher than room temperature. Accordingly, when performing the high temperature test, the air passing through the flow channel $P_4$ is heated by the heat exchanger 63.

As described above, in both the low-temperature test and the high-temperature test, because the atmosphere temperature in the chamber 42 is set to a temperature higher than the temperature of the fluid passing through the flow channel $P_4$, the fluid passing through the flow channel $P_4$ is heated by heat exchanging. Accordingly, it is possible to reduce the heating amount of the fluid with the heater 64 by utilizing the heat of the atmosphere in the chamber 42 with the heat exchanger 63.

The flow channel $P_5$ is connected to the downstream side of the flow channel $P_4$. As shown in FIG. 1, the heater 64 is provided on the flow channel $P_5$. The heater 64 heats the fluid passing through the flow channel $P_5$. As described above, because the fluid to be heated by the heater 64 is previously heated by the heat exchanger 63, a heater having a small output can be used as the heater 64. The temperature sensor 65 is provided downstream of the heater 64 on the flow channel $P_5$.

The heater 64 is controlled by the controller 80 using the detection result of the temperature sensor 65. The control of the heater 64 by the controller 80 will be described in detail later. The heater 64 and the temperature sensor 65 are preferably disposed as close to the socket 20 as possible, thus it is possible to increase the accuracy of the temperature control of the DUT 100. The temperature sensor 65 corresponds to an example of the "second acquirer" in the aspect of one or more embodiments.

As shown in FIG. 6, the flow channel $P_5$ of the socket temperature adjusting unit 60 is connected to a flow channel $P_6$ formed inside the socket guide 25. The flow channel $P_6$ is connected to the inner space 24 of the socket 20, and fluid is supplied to the inner space 24 through the flow channel $P_6$. Further, a flow channel $P_7$ of the socket guide 25 is connected to the inner space 24 of the socket 20, and the fluid passed through the inner space 24 is exhausted to the outside from the flow channel $P_7$. Because the fluid in one or more embodiments is gas, it is not necessary to collect the used fluid.

The socket 20 includes a housing 21, a plurality of contactors 22, an elastic body 23, and the inner space 24.

The housing 21 includes a base member 211 and a top plate 212. The base member 211 is provided on test head 12. The base member 211 has a plurality of holding holes 211*a*. The top plate 212 also has a plurality of holding holes 212*a* provided so as to face the holding holes 211*a* of the base member 211. The top plate 212 is movably held in the pressing direction of the DUT 100 by an elastic body 23 provided on the base member 211.

The elastic body 23 biases the top plate 212 in a direction away from the base member 211. Although not particularly limited, a spring, rubber, etc. can be exemplified as a specific example of the elastic body 23. For example, a coil spring can be exemplified as specific examples of the spring. The base member 211 and the top plate 212 are separated from each other by the elastic body 23, and an inner space 24 is formed between the base member 211 and the top plate 212.

The contactors 22 are held in the holding holes 211*a* and 212*a*. The contactor 22 is made of metal or the like and contacts the terminal 150 of the DUT 100 in the holding hole 212*a*. As a result, the DUT 100 and the test head 12 are electrically connected. Although not particularly limited, for example, a pogo pin can be exemplified as a specific example of such a contactor 22.

Further, a part of the contactor 22 is exposed to the inner space 24 and is in contact with the fluid supplied to the inner space 24. Because the contactor 22 has a high thermal conductivity, the contactor functions as a heat sink. The fluid supplied to the inner space 24 exchanges heat with the DUT 100 via the contactor 22 to adjust the temperature of the DUT 100.

Figure 7:
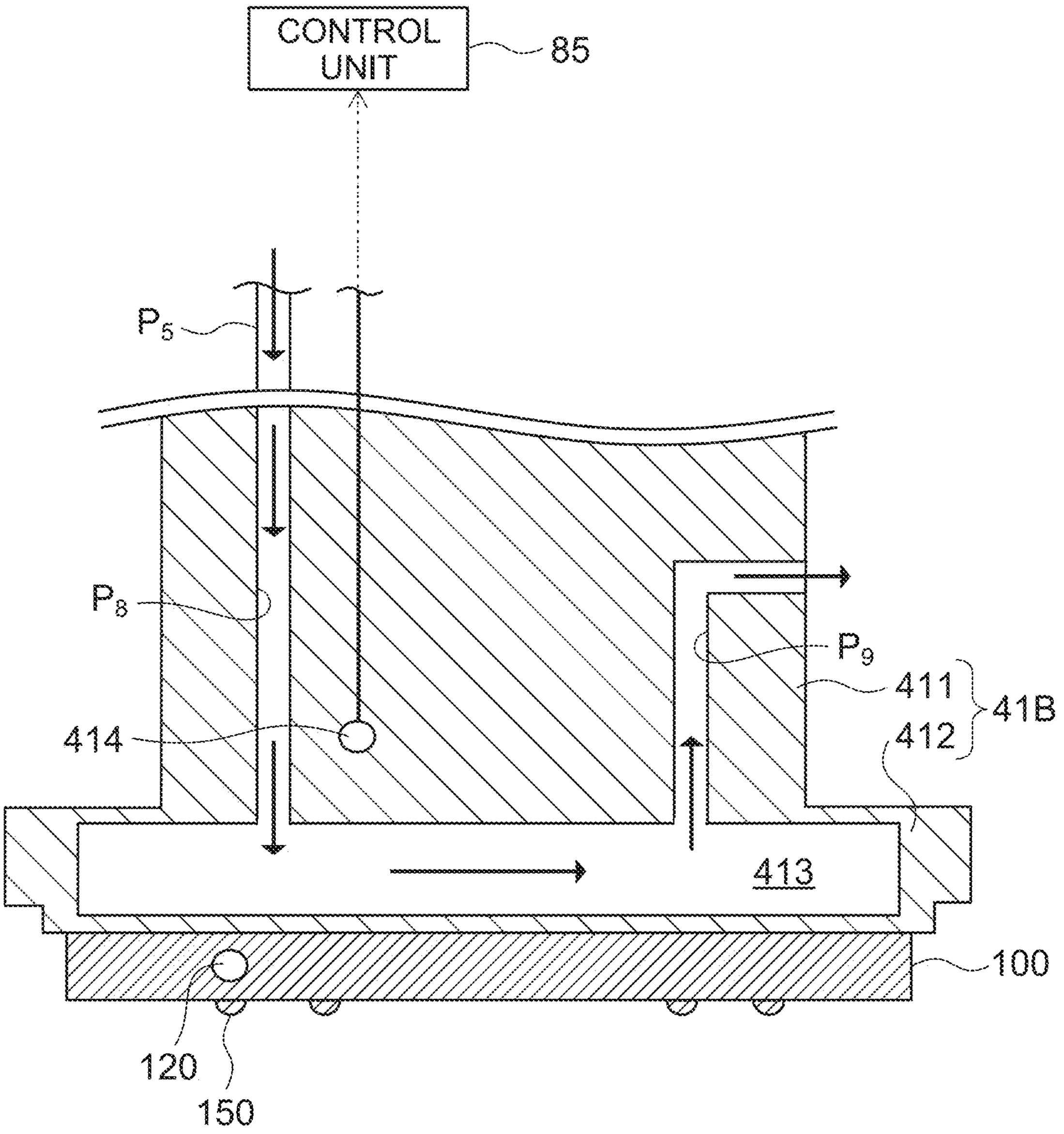
FIG. 7 is a cross-sectional view showing the configuration of the contact arm in one or more embodiments.

As a temperature adjusting device that adjusts the temperature of the DUT 100, instead of the above-mentioned socket temperature adjusting unit 60 that adjusts the temperature of the DUT 100 via the socket 20, a method (pusher cooling method) in which the temperature of the DUT 100 is adjusted via a pusher of the contact arm as shown in FIG. 7 may be used. FIG. 7 is a cross-sectional view showing the configuration of the contact arm 41B in one or more embodiments.

In the example shown in FIG. 7, instead of the socket 20, an inner space 413 is formed in the pusher 412 of the contact arm 41B, and the temperature of the DUT 100 is adjusted by supplying fluid to the inner space 413. The contact arm 41B includes flow channels $P_8$ and $P_9$ and the inner space 413. The flow channel $P_5$ connects the above-described flow channel $P_5$ and the inner space 413, and fluid whose temperature is adjusted by the heater 64 is continuously supplied to the inner space 413. The fluid that passed through the inner space 413 adjusts the temperature of the DUT 100 by exchanging heat with the DUT 100. The flow channel $P_9$ for exhausting fluid is connected to the inner space 413. The fluid exchanged heat with the DUT 100 is exhausted to the outside of the pusher 412 via the flow channel $P_9$. In the example shown in FIG. 7, the heater 64 is controlled using a temperature sensor 414 provided in the pusher 412 instead of the temperature sensor 65 described above.

Figure 8:
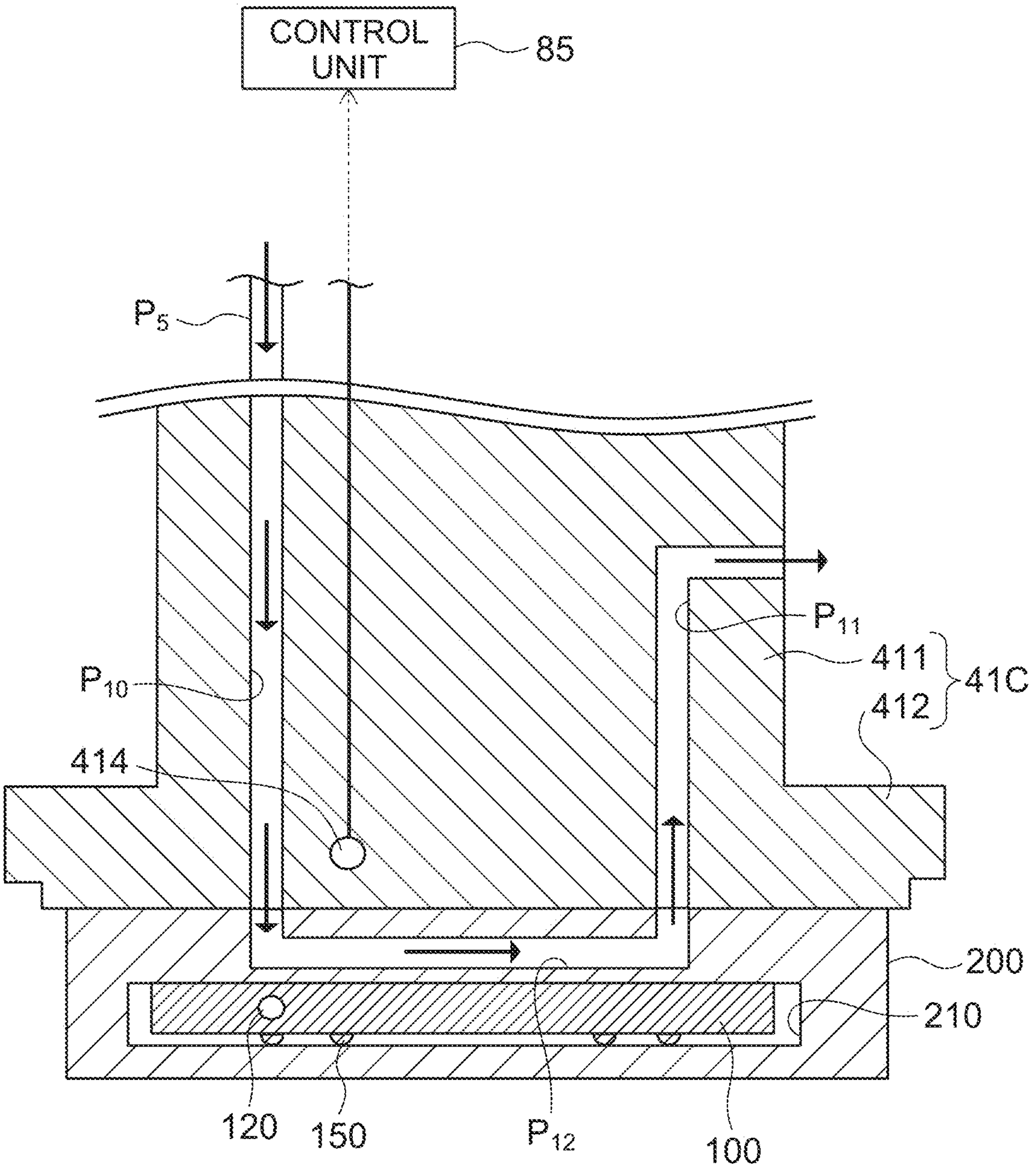
FIG. 8 is a cross-sectional view showing the structure of the contact arm and the carrier in one or more embodiments.

Alternatively, as a temperature adjusting device that adjusts the temperature of the DUT 100, instead of the above-mentioned socket temperature adjusting unit 60, a method (carrier cooling method) in which the temperature of the DUT 100 is adjusted via a pusher of a contact arm and a carrier as shown in FIG. 8 may also be used. FIG. 8 is a cross-sectional view showing the structure of a contact arm 41C and a carrier 200 in one or more embodiments.

In the example shown in FIG. 8, the contact arm 41C holds the carrier 200 that accommodates the DUT 100, and the DUT 100 and the socket 20 are electrically connected via the carrier 200 by pressed the carrier 200 against the socket 20. A flow channel $P_{12}$ through which fluid passes is formed in the carrier 200. Although not particularly limited, for example, a carrier described in JP2023-16503A can be used as such a carrier 200.

In the example shown in FIG. 8, flow channels $P_{10}$ and $P_{11}$ are formed in the contact arm 41C. The flow channel $P_{10}$ is connected to the above-described flow channel $P_5$, and fluid whose temperature is adjusted by the heater 64 is continuously supplied to the flow channel $P_{10}$. Further, the flow channels $P_{10}$ and $P_{11}$ are open at the front-end surface of the pusher 412 so as to face the inlet and outlet of the flow channel $P_{12}$ of the carrier 200, and the flow channels $P_{10}$ and $P_{11}$ of the contact arm 41 communicate with the flow channel $P_{12}$ of the carrier 200 in a state when the contact arm 41 holds the carrier 200. Therefore, the fluid supplied to the flow channel $P_{10}$ of the contact arm 41 enters the flow channel $P_{12}$ of the carrier 200 and exchanges heat with the DUT 100 to adjust the temperature of the DUT 100. Then, the fluid passed through the flow channel $P_{12}$ is exhausted to the outside of the pusher 412 via the flow channel $P_{11}$. In the example shown in FIG. 8 as well, the heater 64 is controlled using a temperature sensor 414 provided in the pusher 412 instead of the temperature sensor 65 described above.

Alternatively, instead of the above-described temperature adjuster 50, other temperature adjusters including a two-liquid mixing method, a gas mixing method, a chamber method, a hot plate method, and a Peltier method may be used.

The two-liquid mixing method is a method in which a heating liquid and a cooling liquid are mixed at an arbitrary ratio and are supplied to the pusher. Although not particularly limited, the two-liquid mixing method is, for example, a method as described in US 2019/302178 A1.

The gas mixing method is a method in which a mixed fluid formed by mixing a gas (nitrogen or air) that is continuously supplied and whose temperature is adjusted by a heater and air at room temperature intermittently supplied is supplied to a socket. Although not particularly limited, the gas mixing method is, for example, a method as described in WO2023/084612 and WO2023/084613.

The chamber method is a method in which the temperature of the DUT is adjusted by controlling the atmosphere temperature in the chamber using a heater and nitrogen gas. The hot plate method is a method in which the temperature of the DUT is adjusted by placing the DUT on a plate and heating the plate. The Peltier method is a method in which the temperature of the DUT is adjusted by heating or cooling a Peltier element that is in thermally contacted with the DUT.

As shown in FIG. 1 and FIG. 4, the controller 80 controls the socket temperature adjusting unit 60 and the chamber temperature adjusting unit 70 described above. Specifically, the controller 80 controls the valves 62*a* to 62*c* and the heater 64 of the socket temperature adjusting unit 60 and the heater 72 and the fan 73 of the chamber temperature adjusting unit 70.

When performing the low-temperature test on the DUT 100, the controller 80 controls the valve 62*a* of the socket temperature adjusting unit 60 to open the valve 62*a*, and thus nitrogen as a refrigerant is continuously supplies to the socket 20. Further, the controller 80 controls the heater 64 of the socket temperature adjusting unit 60 to heat the refrigerant, and the temperature of the refrigerant is adjusted to the target temperature Tsp'. Further, the controller 80 controls the valve 62*b* of the socket temperature adjusting unit 60 to open the valve 62*b*, and thus nitrogen is supplied to the chamber 42 and the atmosphere temperature in the chamber 42 is adjusted to a target temperature. In this low-temperature test, the valve 62*c* of the socket temperature adjusting unit 60 is kept closed, and the heater 72 of the chamber temperature adjusting unit 70 is not used.

On the other hand, when performing the high-temperature test on the DUT 100, the controller 80 controls the valve 62*c* of the socket temperature adjusting unit 60 to open the valve 62*c*, and thus air as a heating medium is continuously supplies to the socket 20. Further, the controller 80 controls the heater 64 of the socket temperature adjusting unit 60 to heat the heating medium, and the temperature of the heating medium is adjusted to the target temperature Tsp'. Further, the controller 80 controls the heater 72 of the chamber temperature adjusting unit 70 to heat the atmosphere in the chamber 42, and thus the atmosphere temperature in the chamber 42 is adjusted to a target temperature. In this high-temperature test, the valves 62*a* and 62*b* of the socket temperature adjusting unit 60 are kept closed.

The controller 80 of one or more embodiments includes a target temperature setting unit 81 and a control unit 85 in order to control the heater 64 of the socket temperature adjusting unit 60. The target temperature setting unit 81 and the control unit 85 control the temperature of the fluid supplied to the socket 20 by controlling the heater 64 using the second digital signal output from the signal generator 30 of the tester 10.

The controller 80 of one or more embodiments is functionally realized by, for example, a computer that controls the handler 40. Although not particularly shown, the computer is an electronic computer including a CPU (processor), a main storage device (such as a RAM), a secondary storage device (such as a hard disk and an SSD), interfaces, and the like. The computer can functionally realize the target temperature setting unit 81 and the control unit 85 by reading and executing a program stored in the secondary storage device.

As shown in FIG. 4, the target temperature setting unit 81 set the target temperature Tsp' using the second digital signal output from the tester 10. The target temperature setting unit 81 includes a reference setting unit 82, a converting unit 83, and a correcting unit 84. The method for setting the target temperature Tsp' by the target temperature setting unit 81 is not particularly limited to the method described below.

The reference setting unit 82 stores a reference value (reference temperature) Tsp that is the original (initial) target temperature of the DUT 100 at the time of the test, and the reference value Tsp is output from the reference setting unit 82 to the correcting unit 84. The reference value Tsp is set in the reference setting unit 82, for example, by being input into the controller 80 via an input device by an operator of the electronic device testing apparatus 1.

On the other hand, the second digital signal is input to the converting unit (the synchronizing unit) 83 from the signal generator 30 of the tester 10 described above. As described above, the second digital signal is irregularly (not periodically) output from the signal generator 30. Therefore, the converting unit 83 converts the second digital signal from an irregular signal (not periodical signal/asynchronous signal) to a regular signal (periodical signal/synchronous signal), and the converted second digital signal is sent to the correcting unit 84. Both the reference value Tsp and the detected temperature Tp described later are regular signals (periodical signals), and the second digital signal is converted into a regular signal (periodical signal/synchronization signal) synchronized with these regular signals (periodical signals) Tsp and Tp.

Specifically, upon receiving the second digital signal from the signal generator 30, the converting unit 83 stores the second digital signal in the storage unit and outputs this second digital signal to the correcting unit 84 at regular time intervals. Then, when a new second digital signal is received from the signal generator 30, the second digital signal stored in the storage unit is updated, and the updated second digital signal is output to the correcting unit 84 at regular time intervals. The converting unit 83 may convert the second digital signal from an irregular signal to a regular signal by using a Kalman filter.

As described above, in one or more embodiments, because the second digital signal is converted from an irregular signal to a regular signal by the converting unit 83, it is possible to stably control the temperature adjuster 50 by the controller 80 even if the timing at which the acquiring unit 31 acquires the first digital signal is irregular (not periodical) due to branching of the test program because of acquiring the first digital signal during the test.

The correcting unit 84 sets the target temperature Tsp' by correcting the reference value Tsp, which is set by the reference setting unit 82, using the second digital signal converted into a regular signal by the converting unit 83. Here, the second digital signal based on the first digital signal indicating the internal temperature of the DUT 100 with high accuracy should match the reference value Tsp. Therefore, in one or more embodiments, the correcting unit 84 automatically adjusts the target temperature Tsp' in consideration of the second digital signal by adding the difference between the reference value Tsp and the second digital signal to the reference value Tsp. Specifically, the correcting unit 84 includes a first calculating unit 841, an adjusting unit 842, and a second calculating unit 843. The method of correcting the reference value Tsp by the correcting unit 84 is not particularly limited to the method described below.

The first calculating unit 841 receives the reference value Tsp from the reference setting unit 82 and also receives the second digital signal converted into a regular signal by the converting unit 83. Then, the first calculating unit 841 calculates the difference $\Delta T$ between the reference value Tsp and the second digital signal and outputs the difference $\Delta T$ to the adjusting unit 842.

The adjusting unit 842 adjusts the difference $\Delta T$ calculated by the first calculating unit 841 and outputs the adjusted difference $\Delta T$ to the second calculating unit 843. Specifically, the adjusting unit 842 adjusts the difference $\Delta T$ by multiplying the difference ΔT by a gain constant K. For example, the gain constant K is set to be less than 1 (K<1), and the adjusting unit 842 adjusts the difference ΔT to be small. As a result, it is possible to suppress rapid variation of the second digital signal and stabilize the behavior of the controller 80. The adjusting unit 842 may adjust the difference ΔT using PID control instead of the above-mentioned proportional control. Furthermore, if the reliability of the second digital signal is high, the gain constant K may be set to 1 (K=1) or may be larger than 1 (K>1).

The second calculating unit 843 receives the adjusted difference ΔT from the adjusting unit 842 and also receives the reference value Tsp from the reference setting unit 82. Then, the second calculating unit 843 calculates the target temperature Tsp' by adding the difference ΔT adjusted by the adjusting unit 842 to the reference value Tsp, and the second calculating unit 843 outputs this target temperature Tsp' to the control unit 85.

The control unit 85 controls the heater 64 of the socket temperature adjusting unit 60 based on the target temperature Tsp' set by the target temperature setting unit 81. The control unit 85 includes a third calculating unit 86.

The temperature sensor 65 of the socket temperature adjusting unit 60 is connected to the third calculating unit 86. The third calculating unit 86 calculates the difference between the target temperature Tsp' input from the second calculating unit 843 of the target temperature setting unit 81 and the detected temperature Tp detected by the temperature sensor 65. Then, the control unit 85 calculates a control amount of PID control that reduces this difference and adjusts the temperature of the fluid passing through the flow channel $P_5$ by performing PWM control on the heater 64 according to the control amount.

Although the current temperature of the DUT 100 is acquired using the temperature sensor 65 disposed near the socket 20 in one or more embodiments, the method of acquiring the current temperature of the DUT 100 is not particularly limited to this.

For example, as the current temperature of the DUT 100, a detected result detected by a temperature sensor provided on the pusher of the contact arm (for example, the temperature sensor 414 in FIG. 7 and FIG. 8) may be input to the third calculating unit 86.

Alternatively, as the current temperature of the DUT 100, the junction temperature Tj calculated using an analog signal output from a thermal diode included in the DUT 100 may be input to the third calculating unit 86. The junction temperature Tj is calculated, for example, by converting the analog signal output from the thermal diode into a digital signal and further performing a predetermined correcting process by a workstation that is a control unit of the tester 10.

Alternatively, as the current temperature of the DUT 100, for example, as described in US 2019/0101587 A1, a corrected value Tj' obtained by correcting the above junction temperature Tj with an analog signal of a thermal diode may be input to the third calculating unit 86. When the junction temperature Tj or the corrected value Tj' is used as the current temperature of the DUT 100, an acquiring device that acquires the current temperature of the DUT 100 is provided in at least one of the tester 10 and the handler 40.

As described above, in one or more embodiments, the signal generator 30 generates the second digital signal using the first digital signal indicating the internal temperature of the DUT 100 output from the temperature detecting circuit 120 included in the DUT 100, and the controller 80 controls the temperature adjuster 50 using the second digital signal. In this way, in one or more embodiments, because the temperature adjuster 50 is controlled in consideration of the second digital signal based on the first digital signal that indicates the internal temperature of the DUT 100 with high accuracy, the adjusting work of the controller 80 is not required. Therefore, it is possible to speed up the launching of the test of the new kind of DUT and it is also possible to improve the accuracy of temperature adjusting of the DUT 100. In particular, when testing a large number of DUTs at the same time, it is possible to significantly shorten the time required to launch the test of the new kind of DUT.

Further, for example, when the DUT 100 is a memory device, it may not be possible to assign a dedicated terminal 150 for a thermal diode due to a restriction on the number of terminals 150. In this case, only the temperature detecting circuit 120 can measure the internal temperature of the DUT 100. In one or more embodiments, because the temperature adjuster 50 is controlled using the second digital signal based on the first digital signal acquired from the temperature detecting circuit 120, it is possible to adjust the temperature of the above-described memory device 100 with high accuracy.

Although not particularly limited, for example, when the DUT 100 is an HBM (High Bandwidth Memory) for generative AI, the DUT 100 includes a plurality of memory dies stacked on each other, and it may be difficult to assign the dedicated terminals 150 for the thermal diodes that the plurality of memory dies respectively have. Further, the plurality of memory dies of the HBM 100 may generate a high amount of heat and may require highly accurate temperature control. On the other hand, in one or more embodiments, because the temperature adjuster 50 is controlled using the second digital signal based on the first digital signal acquired from the temperature detecting circuit 120, the temperature of the DUT 100 that generates a high amount of heat as described above may be adjusted in real time with high accuracy.

Further, for example, because some members existing in the chamber have a large heat capacity and the temperature change may continue for several hours, the temperature of the DUT may vary over a long period of time due to temperature change of such members. On the other hand, in one or more embodiments, because it is possible to dynamically adjust the controller 80 using the second digital signal, it is possible to configure the temperature adjusting system that can cope with such long-term temperature change and is robust against the drift phenomenon (continuous deviation of slow temperature result).

Further, as mentioned above, although there are various methods of the temperature adjuster (for example, the pusher cooling method, carrier cooling method, two-liquid mixing method, gas mixing method, chamber method, hot plate method, Peltier method, etc. described above), the control unit may be designed exclusively for each of these various temperature adjusters. In one or more embodiments, because the target temperature Tsp' is set by the target temperature setting unit 81 using the second digital signal, it is sufficient to simply replace the target temperature inputting unit that inputs the target temperature Tsp to the control unit with the described above target temperature setting unit 81 in the existing temperature adjuster. Therefore, it is possible to keep changes in the design of the control unit to a minimum, and it is possible to easily introduce temperature control using the above-mentioned second digital signal into existing temperature adjuster.

Further, because the second digital signal is a signal based on the irregular first digital signal, the second digital signal may be unstable. Therefore, for example, when the second digital signal is directly input to the third calculating unit 86 of the control unit 85 as the current temperature of the DUT 100 instead of the detected temperature Tp of the temperature sensor 65, the behavior of the controller 80 may be unstable. On the other hand, in one or more embodiments, because the reference value Tsp that is the original target temperature is corrected by the target temperature setting unit 81 using the second digital signal, it is possible to stabilize the control of the temperature adjuster 50 of the controller 80. That is, if the second digital signal based on the irregular first digital signal is handled in the control loop, the control loop may be unstable. On the other hand, in one or more embodiments, it is possible to stabilize the control of the controller 80 by handling the second digital signal as a correction term outside the control loop.

Figure 9:
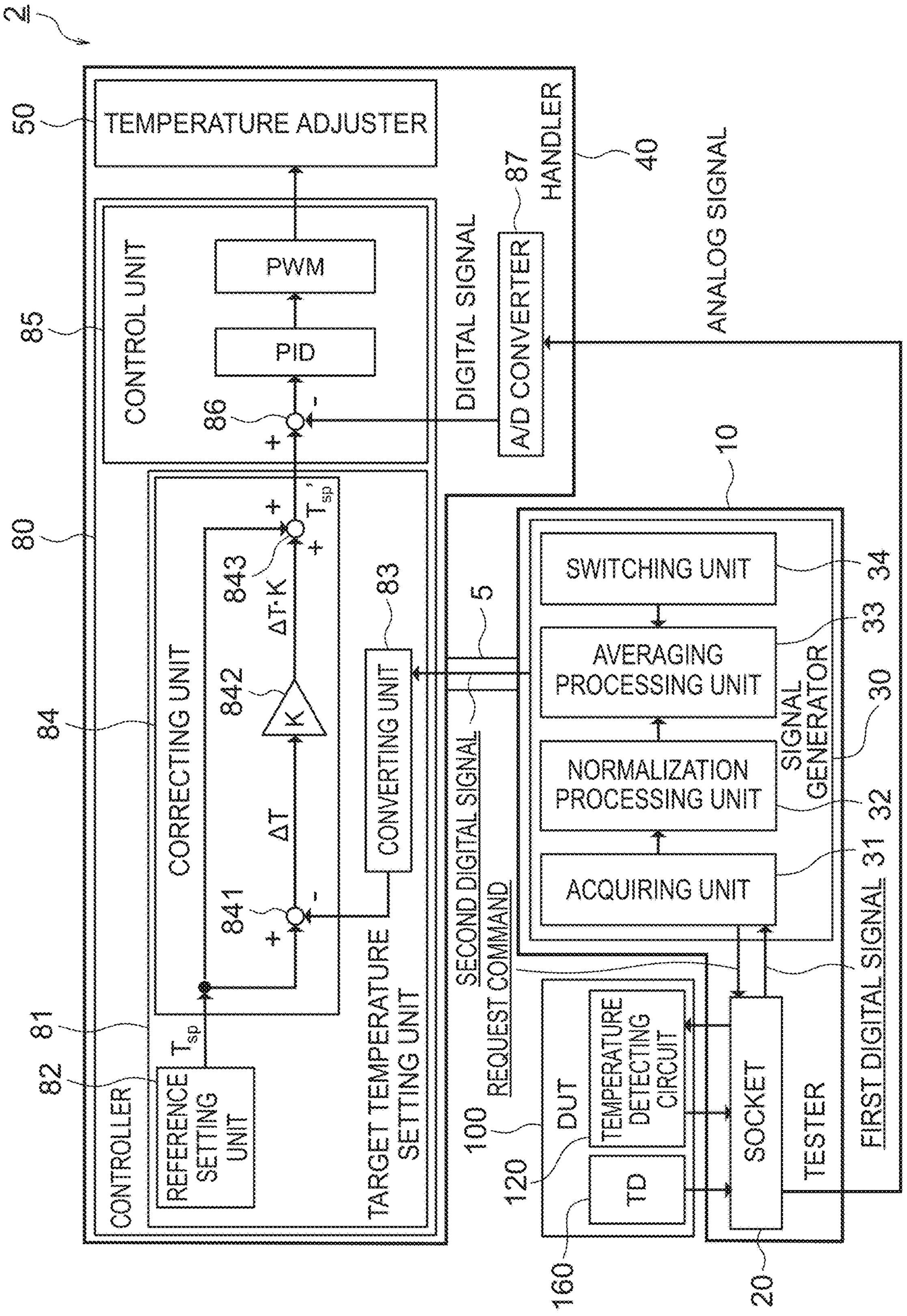
FIG. 9 is a block diagram showing a modification of the temperature adjusting system in one or more embodiments.

As shown in FIG. 9, an analog signal output from the thermal diode 160 included in the DUT 100 may be used as the current temperature of the DUT 100. FIG. 9 is a block diagram showing a modification of the temperature adjusting system in one or more embodiments.

In this case, as shown in FIG. 9, the handler 40 includes an A/D converter 87 instead of the temperature sensor 65. The A/D converter 87 is connected to the socket 20 and is also connected to the third calculating unit 86.

On the other hand, the thermal diode 160 of the DUT 100 is connected to the terminal 150 of the DUT 100. When the DUT 100 is pressed against the socket 20, the thermal diode 160 and the A/D converter 87 are electrically connected via the terminal 150 of the DUT 100 and the contacts 22 of the socket 20, and an analog signal indicating the current temperature of the DUT 100 is transmitted from the thermal diode 160 to the A/D converter 87.

Because the signal output from the thermal diode 160 is an analog signal, this analog signal is continuously output from the thermal diode 160 to the A/D converter 87. Further, a dedicated terminal 150 is assigned to the thermal diode 160, and the above-mentioned analog signal is always output from the thermal diode 160 to the A/D converter 87.

The A/D converter 87 converts the analog signal output from thermal diode 160 into a digital signal and outputs the digital signal to the third calculating unit 86. The digital signal output from the A/D converter 87 is a signal obtained by simply performing digital conversion on the analog signal output from the thermal diode 160, and the A/D converter 87 does not perform calculating such as correcting the analog signal.

In the example shown in FIG. 9, the signal generator 30 corresponds to an example of the "first acquirer" in the aspect of one or more embodiments, the A/D converter 87 corresponds to an example of the "second acquirer" in the aspect of one or more embodiments, the temperature detecting circuit 120 of the DUT 100 corresponds to an example of the "first temperature detecting circuit" in the aspect of one or more embodiments, and the thermal diode 160 of the DUT 100 corresponds to an example of the "second temperature detection circuit" in the aspect of one or more embodiments.

In the example shown in FIG. 9, the controller 80 controls the temperature adjuster 50 using the first signal output from the signal generator 30 that acquires the digital signal from the temperature detecting circuit 120 and the second signal output from the A/D converter 87 that acquires the analog signal from the thermal diode 160. In this way, because the temperature adjuster 50 is controlled using two types of outputs from the mutually different temperature detecting circuits 120 and 160, the adjusting work of the controller 80 is not required. Therefore, it is possible to speed up the launching of the test of the new kind of DUT and it is also possible to improve the accuracy of temperature adjusting of the DUT 100. In particular, when testing a large number of DUTs at the same time, it is possible to significantly shorten the time required to launch the test of the new kind of DUT.

Instead of the thermal diode 160, the DUT 100 may include an element having resistive characteristic or bandgap characteristic depending on the temperature as the second temperature detecting circuit. Alternatively, instead of the thermal diode 160, a thermocouple may be embedded in DUT 100 as the second temperature-detecting circuit.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

Figure 10:
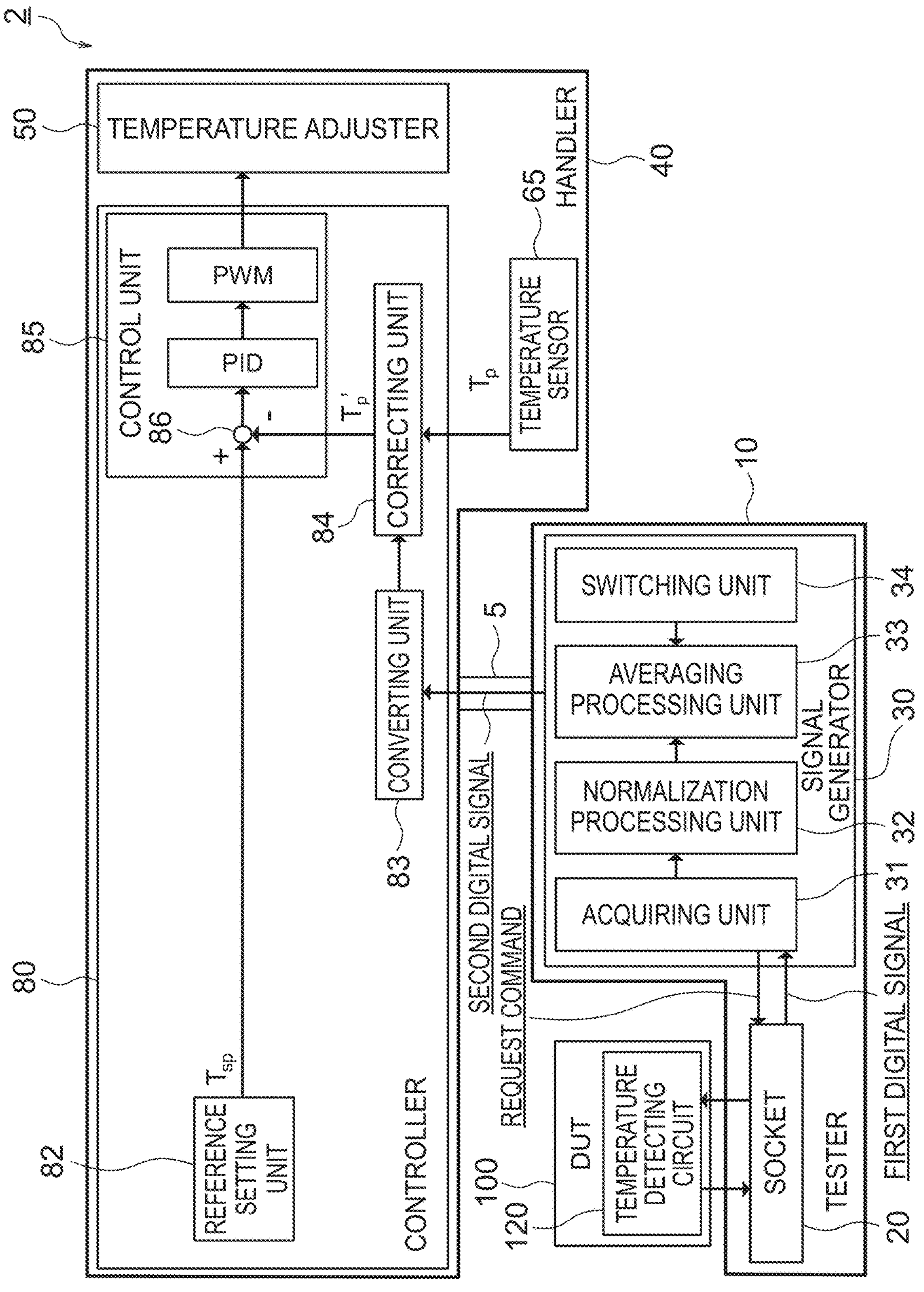
FIG. 10 is a block diagram showing a modification of the controller in one or more embodiments.

For example, although the target temperature Tsp is corrected by the correcting unit 84 in the above embodiments, the correction target of the correcting unit 84 is not particularly limited to this, and the correcting unit 84 may correct the detected temperature Tp detected by the temperature sensor 65. In this case, as shown in FIG. 10, the reference setting unit 82 inputs the reference value Tsp as it is as the target temperature to the third calculating unit 86 of the control unit 85, the correcting unit 84 is interposed between the temperature sensor 65 and the third calculating unit 86, and the correcting unit 84 corrects the detected temperature Tp of the temperature sensor 65 and inputs the corrected detected temperature Tp' to the third calculating unit 86. Although not particularly shown, the correcting unit 84 includes a first calculating unit 841 that calculates a difference between the second digital signal and the detected temperature Tp, an adjusting unit 842 that adjusts the difference, and a second calculating unit 843 that adds the adjusted difference to the detected temperature Tp. Then, the third calculating unit 86 calculates a difference between the reference value Tsp and the corrected detected temperature Tp', and the control unit 85 controls the heaters 64 based on the difference. FIG. 10 is a block diagram showing a modification of the controller in one or more embodiments.

Also in this case, for example, as compared with the case where the unstable second digital signal is directly inputted to the third calculating unit 86 of the control unit 85 as the current temperature of the DUT 100, because the detected temperature Tp of the temperature sensor 65 is corrected using the second digital signal, it is possible to stabilize the control of the temperature adjuster 50 by the controller 80. That is, if the second digital signal based on the irregular first digital signal is handled in the control loop, the control loop may be unstable. On the other hand, in the example shown in FIG. 10, it is possible to stabilize the control of the controller 80 by handling the second digital signal as a correction term outside the control loop.

When the temperature detected by the above-mentioned temperature sensor of the pusher (for example, the temperature sensor 414 in FIG. 7 and FIG. 8), the junction temperature Tj, or the correction value Tj' of the junction temperature is used as the current temperature of the DUT 100 instead of the temperature sensor 65, the corrected temperature obtained by correcting these values by the correcting unit 84 may be input to the third calculating unit 86.

Figure 11:
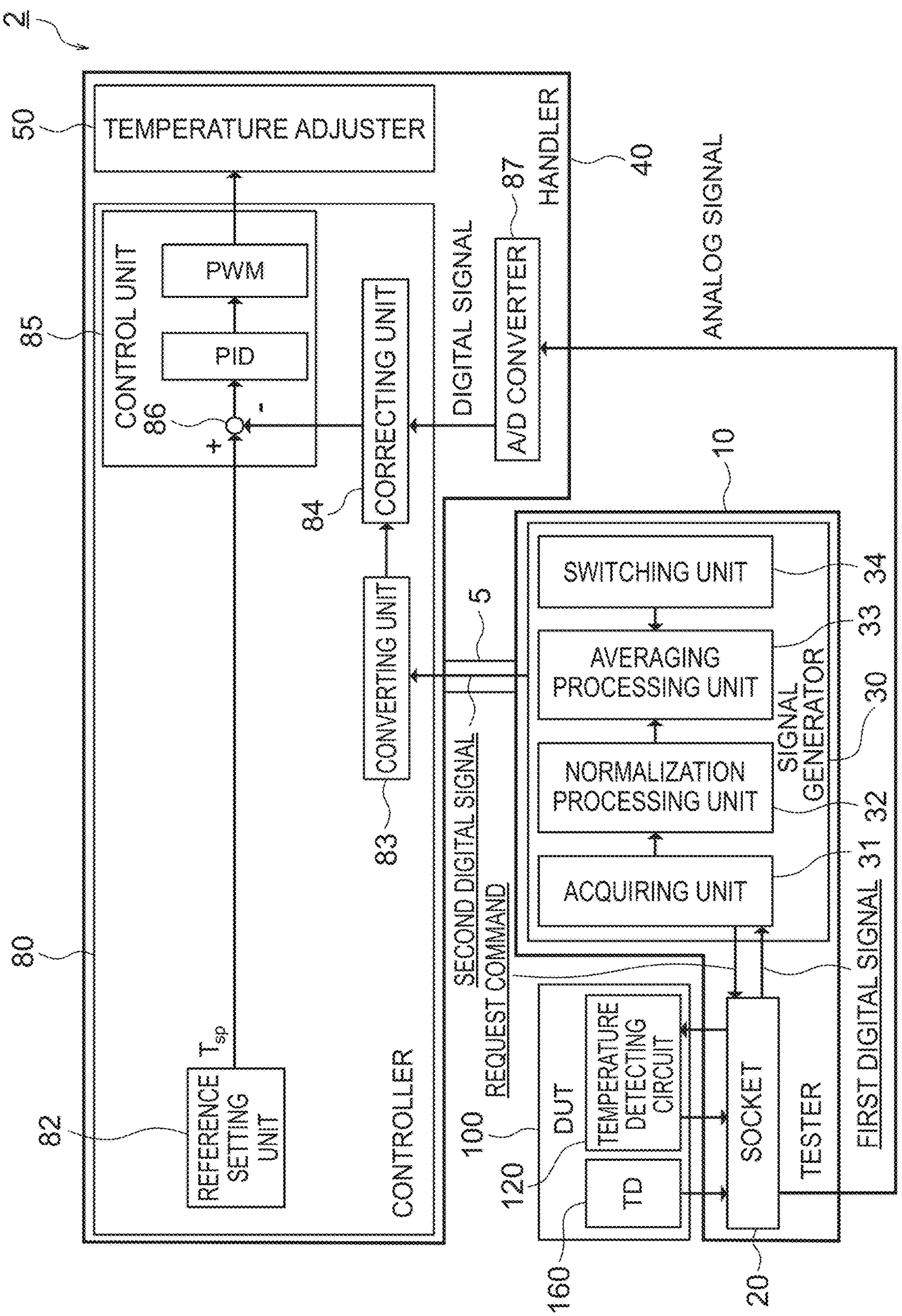
FIG. 11 is a block diagram showing a modification of the temperature adjusting system shown in FIG. 10.

Alternatively, as shown in FIG. 11, an analog signal output from the thermal diode 160 included in the DUT 100 may be used as the current temperature of the DUT 100.

FIG. 11 is a block diagram showing a modification of the temperature adjusting system shown in FIG. 10.

In this case, similar to the example shown in FIG. 9 described above, the handler 40 includes an A/D converter 87 instead of the temperature sensor 65 as shown in FIG. 11. The A/D converter 87 is connected to the socket 20 and is also connected to the correcting unit 84. On the other hand, the thermal diode 160 of the DUT 100 is connected to the terminal 150 of the DUT 100. When the DUT 100 is pressed against the socket 20, the thermal diode 160 and the A/D converter 87 are electrically connected via the terminal 150 of the DUT 100 and the contacts 22 of the socket 20, and an analog signal indicating the current temperature of the DUT 100 is transmitted from the thermal diode 160 to the A/D converter 87. The A/D converter 87 converts the analog signal output from thermal diode 160 into a digital signal and outputs the digital signal to the correcting unit 84.

Although the tester 10 includes the acquiring unit 31, the normalization processing unit 32, the averaging processing unit 33, and the switching unit 34 in the above-described embodiments, it is not particularly limited to this. For example, the handler 40 may include at least one of the acquiring unit 31, the normalization processing unit 32, the averaging processing unit 33, and the switching unit 34. Further, although the handler 40 includes the target temperature setting unit 81 and the control unit 85 in the above-described embodiments, it is not particularly limited to this. For example, the tester 10 may include at least one of the target temperature setting unit 81 and the control unit 85.

Although an example in which the temperature control using the second digital signal was applied to the back-end process electronic device testing apparatus 1 including the tester 10 and the handler 40 is described in the above-described embodiments, the temperature control using the second digital signal described above may also be applied to a front-end process (wafer process) semiconductor testing apparatus including a prober. Alternatively, the temperature control using the second digital signal described above may be applied to a burn-in apparatus or an SLT (System Level Test) apparatus.

EXPLANATIONS OF LETTERS OR NUMERALS

1 . . . Electronic device testing apparatus
2 . . . Temperature adjusting system
10 . . . Tester
20 . . . Socket
21 . . . Housing
22 . . . Contactor
23 . . . Elastic body
24 . . . Inner space
25 . . . Socket guide
$P_6$, $P_7$ . . . Flow channel
30 . . . Signal generator
31 . . . Acquiring unit
32 . . . Normalization processing unit
33 . . . Averaging processing unit
34 . . . Switching unit
40 . . . Handler
41, 41B, 41C . . . Contact arm
412 . . . Pusher
413 . . . Inner space
414 . . . Temperature sensor
$P_8$ to $P_{11}$ . . . Flow channel
42 . . . Chamber
50 . . . Temperature adjuster
60 . . . Socket temperature adjusting unit
61*a*, 61*b* . . . Connecting part
$P_1$ to $P_5$ . . . Flow channel
J . . . Junction part
62*a* to 62*c* . . . Valve
63 . . . Heat Exchanger
64 . . . Heater
65 . . . Temperature sensor
70 . . . Chamber temperature adjusting unit
80 . . . Controller
81 . . . Target temperature setting unit
82 . . . Reference setting unit
83 . . . Converting unit
84 . . . Correcting unit
841 . . . First calculating unit
842 . . . Adjusting unit
843 . . . Second calculating unit
85 . . . Control unit
86 . . . Third calculating unit
87 . . . A/D converter
100 . . . DUT
120 . . . Temperature detecting circuit
130 . . . Measuring unit
140 . . . Calibrating unit
160 . . . Thermal diode

What is claimed is:

1. A temperature adjusting system comprising:

a temperature adjuster that adjusts a temperature of a device under test (DUT);

a first acquirer that acquires, from a first temperature detecting circuit of the DUT, a first digital signal indicating an internal temperature of the DUT and that outputs a second digital signal; and a controller that controls the temperature adjuster using the second digital signal.

2. The temperature adjusting system according to claim 1, wherein the first acquirer generates the second digital signal using the first digital signal.

3. The temperature adjusting system according to claim 1, wherein the controller:

sets a target temperature using the second digital signal, and controls the temperature adjuster based on the target temperature.

4. The temperature adjusting system according to claim 3, wherein the controller:

sets a reference value, and corrects the reference value using the second digital signal to set the target temperature.

5. The temperature adjusting system according to claim 4, wherein the controller:

calculates a difference between the reference value and the second digital signal, adjusts the difference, and adds the adjusted difference to the reference value.

6. The temperature adjusting system according to claim 3, further comprising:

a second acquirer that acquires a current temperature of the DUT, wherein the controller controls the temperature adjuster based on the target temperature and the acquired current temperature.

7. The temperature adjusting system according to claim 1, further comprising:

a second acquirer that acquires a current temperature of the DUT, wherein the controller:

corrects the current temperature using the second digital signal, and controls the temperature adjuster based on the corrected current temperature.

8. The temperature adjusting system according to claim 1, wherein the second digital signal is irregularly output from the first acquirer to the controller, and the controller converts the second digital signal from an irregular signal to a regular signal.

9. The temperature adjusting system according to claim 1, wherein the first acquirer acquires the first digital signal using test instructions that perform a test of the DUT.

10. The temperature adjusting system according to claim 1, wherein the first acquirer executes normalization processing on the first digital signal.

11. The temperature adjusting system according to claim 1, wherein the first acquirer executes averaging processing on the first digital signal.

12. The temperature adjusting system according to claim 1, wherein the first acquirer:

executes normalization processing on the first digital signal, executes averaging processing on the first digital signal, and enables or disables either the normalization processing or the averaging processing.

13. The temperature adjusting system according to claim 1, wherein the first temperature detecting circuit:

comprises:

a measuring unit that measures the internal temperature of the DUT; and a calibrating unit that calibrates a measurement result of the measuring unit, and outputs the calibrated measurement result as the first digital signal to the first acquirer.

14. A temperature adjusting system comprising:

a temperature adjuster that adjusts a temperature of a device under test (DUT);

a first acquirer that acquires, from a first temperature detecting circuit, a first temperature signal indicating an internal temperature of the DUT and that outputs a first signal;

a second acquirer that acquires, from a second temperature detecting circuit, a second temperature signal indicating a current temperature of the DUT and that outputs a second signal; and a controller that controls the temperature adjuster using the first signal and the second signal.

15. The temperature adjusting system according to claim 14, wherein the first temperature signal is a digital signal from the first temperature detecting circuit of the DUT, and the second temperature signal is an analog signal from the second temperature detecting circuit of the DUT.

16. A controller that controls a temperature adjuster that adjusts a temperature of a device under test (DUT), wherein a first digital signal indicating an internal temperature of the DUT is output from a temperature detecting circuit of the DUT, a second digital signal is output from an acquirer that acquires the first digital signal, and the controller controls the temperature adjuster using the second digital signal.

17. An electronic device handling apparatus that handles the DUT or a carrier holding the DUT and presses the DUT or the carrier to a socket, the electronic device handling apparatus comprising:

the temperature adjuster; and the controller according to claim 16.

18. A tester that tests either a device under test (DUT) electrically connected to a socket or the DUT held in a carrier electrically connected to the socket, the tester comprising:

an acquirer that acquires, from a temperature detecting circuit of the DUT, a first digital signal indicating an internal temperature of the DUT and that outputs a second digital signal.

19. An electronic device testing apparatus that tests the DUT, comprising:

the temperature adjusting system according to claim 1.

20. An electronic device testing apparatus that tests the DUT, comprising:

the temperature adjusting system according to claim 14.

21. An electronic device testing apparatus that tests the DUT, comprising:

the temperature adjuster;

the controller according to claim 16; and a tester, comprising the acquirer, that tests either the DUT electrically connected to a socket or the DUT held in a carrier electrically connected to the socket.

22. An electronic device testing apparatus that tests the DUT, comprising:

the electronic device handling apparatus according to claim 17; and a tester, comprising the acquirer, that tests either the DUT electrically connected to the socket or the DUT held in the carrier electrically connected to the socket.

* * * * *